(12) United States Patent
Park et al.

(10) Patent No.: US 10,267,468 B2
(45) Date of Patent: *Apr. 23, 2019

(54) LIGHT EMITTING MODULE

(71) Applicant: LG Electronics Inc., Seoul (KR)

(72) Inventors: Jun Park, Seoul (KR); Byungwoo Jeoung, Seoul (KR); Sangok Yeo, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/972,635

(22) Filed: May 7, 2018

(65) Prior Publication Data

US 2018/0252377 A1 Sep. 6, 2018

Related U.S. Application Data

(63) Continuation of application No. 15/136,241, filed on Apr. 22, 2016, now Pat. No. 9,982,861.

(30) Foreign Application Priority Data

Apr. 23, 2015 (KR) .................. 10-2015-0057463

(51) Int. Cl.
*F21V 5/04* (2006.01)
*F21S 41/19* (2018.01)
(Continued)

(52) U.S. Cl.
CPC ............. *F21S 41/14* (2018.01); *F21S 41/135* (2018.01); *F21S 41/143* (2018.01); *F21S 41/16* (2018.01); *F21S 41/17* (2018.01); *F21S 41/19* (2018.01); *F21S 41/255* (2018.01); *F21S 41/285* (2018.01); *F21S 41/295* (2018.01); *F21S 41/321* (2018.01); *F21S 41/36* (2018.01); *F21S 41/395* (2018.01); *F21V 5/04* (2013.01); *F21V 7/0033* (2013.01); *F21V 7/0041* (2013.01); *F21V 9/30* (2018.02); *F21V 13/04* (2013.01); *F21V 13/12* (2013.01); *F21V 14/04* (2013.01); *F21V 29/51* (2015.01); *F21V 29/70* (2015.01); *F21V 29/713* (2015.01); *F21V 29/76* (2015.01);
(Continued)

(58) Field of Classification Search
CPC ........................................................ F21S 41/14
USPC ................... 359/328, 619; 362/538, 84, 235
See application file for complete search history.

(56) References Cited

U.S. PATENT DOCUMENTS

2011/0310722 A1* 12/2011 Oishi .................... G11B 7/131
369/112.24
2012/0140501 A1* 6/2012 Nakazato ............... F21S 41/16
362/510
(Continued)

*Primary Examiner* — Allyson N Trail
(74) *Attorney, Agent, or Firm* — Fish & Richardson P.C.

(57) ABSTRACT

A light-emitting module is disclosed. The light-emitting module includes a condensing lens for condensing incident light into a space, a light source for providing first light to pass through the condensing lens, a first optical path conversion member for reflecting the first light to provide first reflected light to pass through the condensing lens, a second optical path conversion member for reflecting the first reflected light to provide second reflected light to pass through the condensing lens and a wavelength conversion unit for receiving the second reflected light, converting a wavelength of the received second reflected light, and radiating light the wavelength of which has been converted.

19 Claims, 29 Drawing Sheets

(51) Int. Cl.
- *F21V 9/30* (2018.01)
- *F21S 41/29* (2018.01)
- *F21S 41/32* (2018.01)
- *F21S 41/14* (2018.01)
- *F21V 29/70* (2015.01)
- *F21V 7/00* (2006.01)
- *F21V 13/12* (2006.01)
- *F21V 29/51* (2015.01)
- *F21V 29/71* (2015.01)
- *F21V 29/76* (2015.01)
- *F21V 13/04* (2006.01)
- *F21V 14/04* (2006.01)
- *H01S 5/323* (2006.01)
- *F21S 41/143* (2018.01)
- *F21S 41/17* (2018.01)
- *F21S 41/20* (2018.01)
- *F21S 41/255* (2018.01)
- *F21S 41/39* (2018.01)
- *F21S 41/36* (2018.01)
- *F21S 41/16* (2018.01)
- *F21S 41/135* (2018.01)
- *F21Y 115/30* (2016.01)
- *F21Y 115/10* (2016.01)
- *F21S 45/47* (2018.01)
- *F21S 41/365* (2018.01)

(52) U.S. Cl.
CPC ......... *H01S 5/32316* (2013.01); *F21S 41/365* (2018.01); *F21S 45/47* (2018.01); *F21Y 2115/10* (2016.08); *F21Y 2115/30* (2016.08)

(56) References Cited

U.S. PATENT DOCUMENTS

| | | | |
|---|---|---|---|
| 2012/0262567 A1* | 10/2012 | Tsuboi | H05K 13/0413 348/86 |
| 2013/0027962 A1* | 1/2013 | Takahashi | F21V 9/30 362/84 |
| 2013/0335813 A1* | 12/2013 | Furuya | G02B 27/01 359/328 |
| 2014/0160441 A1* | 6/2014 | Kim | G03B 21/204 353/33 |
| 2014/0321796 A1* | 10/2014 | Ohtsuka | G02F 1/31 385/3 |
| 2014/0336479 A1* | 11/2014 | Ando | A61B 5/4041 600/310 |
| 2016/0116123 A1* | 4/2016 | Yamanaka | H01S 5/005 362/84 |
| 2016/0187644 A1* | 6/2016 | Bhakta | G02B 26/0833 359/292 |
| 2016/0238216 A1* | 8/2016 | Oka | F21V 13/12 |
| 2017/0356603 A1* | 12/2017 | Narendran | F21S 8/06 |

* cited by examiner

LIGHT EMITTING MODULE

CLAIM OF PRIORITY

This application is a continuation of U.S. application Ser. No. 15/136,241, filed on Apr. 22, 2016, which claims priority to Korean Patent Application Serial No. 10-2015-0057463, filed on Apr. 23, 2015, the entire contents of which are hereby incorporated by reference.

BACKGROUND OF THE INVENTION

1. Field of the Invention

The present invention relates to a light-emitting module and a lamp device for vehicles including the same.

2. Description of the Related Art

In general, vehicles are equipped with lamp devices for illuminating nearby objects during poor lighting conditions or signaling the state of driving to nearby vehicles or pedestrians.

The lamp device for a vehicle includes a head lamp mounted to the front side of the vehicle and a tail lamp mounted to the rear side of the vehicle. The head lamp is a lamp for illuminating the area ahead while driving at night. The tail lamp includes a brake lamp, which is turned on when a driver steps on a brake, and a turn signal lamp, which indicates the direction of travel of the vehicle.

Recently, light-emitting diodes or laser diodes have been used as light sources for automotive lamp devices for good energy efficiency.

In particular, laser diodes are receiving attention due to their high degree of straightness, long-distance illumination and non-disturbance of the field of vision of drivers of oncoming vehicles.

The laser diode needs a phosphor and a lens assembly in order to output white light. However, this complicates the structure of the automotive lamp device, reduces efficiency, and increases the volume of the device. The lamp device for vehicles having a conventional laser diode will now be described.

FIG. 19 is a conceptual view of a conventional light-emitting module. Referring to FIG. 19, a conventional light-emitting module operates in such a manner that blue light generated from a laser diode is focused while passing through a prism 3 and a lens 4, the focused light is reflected from a first reflection unit 5, passes through a light transmissive phosphor 6 and is converted into white light, and the white light is radiated forward from a second reflection unit 7.

However, if the light-emitting module is arranged lengthwise along an optical axis inside the head lamp for vehicles, the length of the head lamp may be increased.

Further, since the conventional light-emitting module needs a relatively large number of components and has an optical path structure in which the light passes through each component only once, it may be hard to manufacture a compact head lamp due to the overall size of the components.

In addition, using a large number of components may increase costs and deteriorate reliability, and using the light transmissive phosphor may cause a decrease in efficiency.

SUMMARY OF THE INVENTION

Therefore, the present invention has been made in view of the above problems, and it is an object of the present invention to provide a light-emitting module which has good efficiency, light convergence and straightness and is reduced in size.

In accordance with an aspect of the present invention, the above and other objects can be accomplished by the provision of a light-emitting module including a condensing lens for condensing incident light into a space, a light source for providing first light to pass through the condensing lens, a first optical path conversion member for reflecting the first light to provide first reflected light to pass through the condensing lens, a second optical path conversion member for reflecting the first reflected light to provide second reflected light to pass through the condensing lens and a wavelength conversion unit for receiving the second reflected light, converting a wavelength of the received second reflected light, and radiating light the wavelength of which has been converted.

The light-emitting module may further include an auxiliary condensing lens for concentrating the second reflected light having passed through the condensing lens on a predetermined spot in the front.

The light source and the second reflection unit may be located eccentrically from a central axis of the condensing lens.

The light source and the second reflection unit may be located opposite each other across the central axis of the condensing lens.

The light source may be spaced apart from the central axis of the condensing lens in a first direction which is perpendicular to the central axis of the condensing lens, and the second reflection unit may be spaced apart from the central axis of the condensing lens in a second direction which is opposite to the first direction.

The first reflection unit may be spaced apart from the central axis of the condensing lens in the first direction.

A first distance between the central axis of the condensing lens and the light source may be smaller than a radius of the condensing lens.

A second distance between the central axis of the condensing lens and the second reflection unit may be smaller than the radius of the condensing lens.

A third distance between the central axis of the condensing lens and the first reflection unit may be smaller than the radius of the condensing lens.

The second reflection unit may convert the first reflected light incident thereon into second reflected light having a wavelength different from that of the first reflected light.

A spot of incidence of a front surface of the condensing lens, on which the first reflected light is incident, may be located apart from the central axis of the condensing lens in the second direction.

A fourth distance between the central axis of the condensing lens and the spot of incidence may be smaller than the first distance or the second distance.

A ratio of the first distance to the second distance may be in the range of 1:0.7 to 1:1.1.

A ratio of the first distance to the fourth distance may be in the range of 1:0.1 to 1:0.6.

The condensing lens may be divided into a first region and a second region by an imaginary section cut along the central axis of the condensing lens, the first light may be incident on the first region, the first reflected light may be incident on the second region, and the second reflected light may be incident on the second region.

The first light may be incident parallel to the central axis of the condensing lens.

The condensing lens may be a non-spherical lens.

The non-spherical lens may include a rear surface which is perpendicular to the central axis of the condensing lens, and a front surface which is formed to be convex in the front direction of the condensing lens.

The second reflection unit may include a wavelength conversion layer for converting a wavelength of incident light, and a reflection layer for reflecting the incident light.

The light source may include a laser diode.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
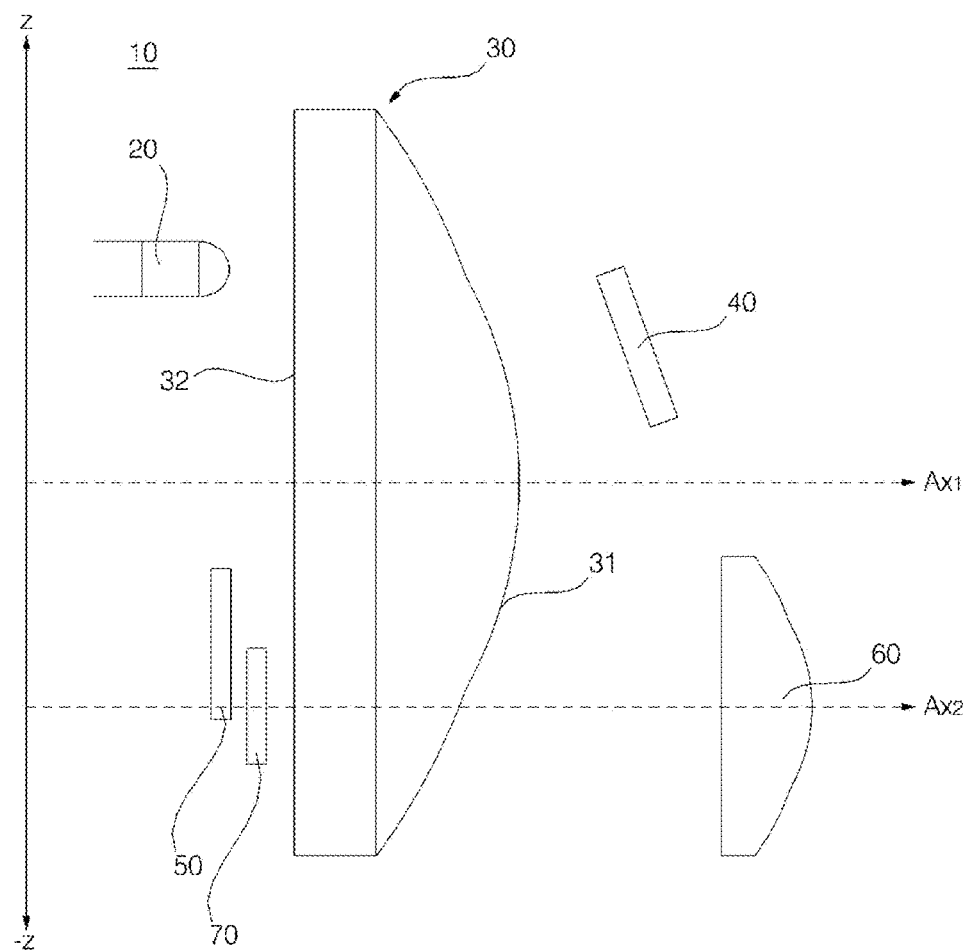
FIG. 1 is a conceptual view of a light-emitting module according to an embodiment of the present invention.
Figure 2:
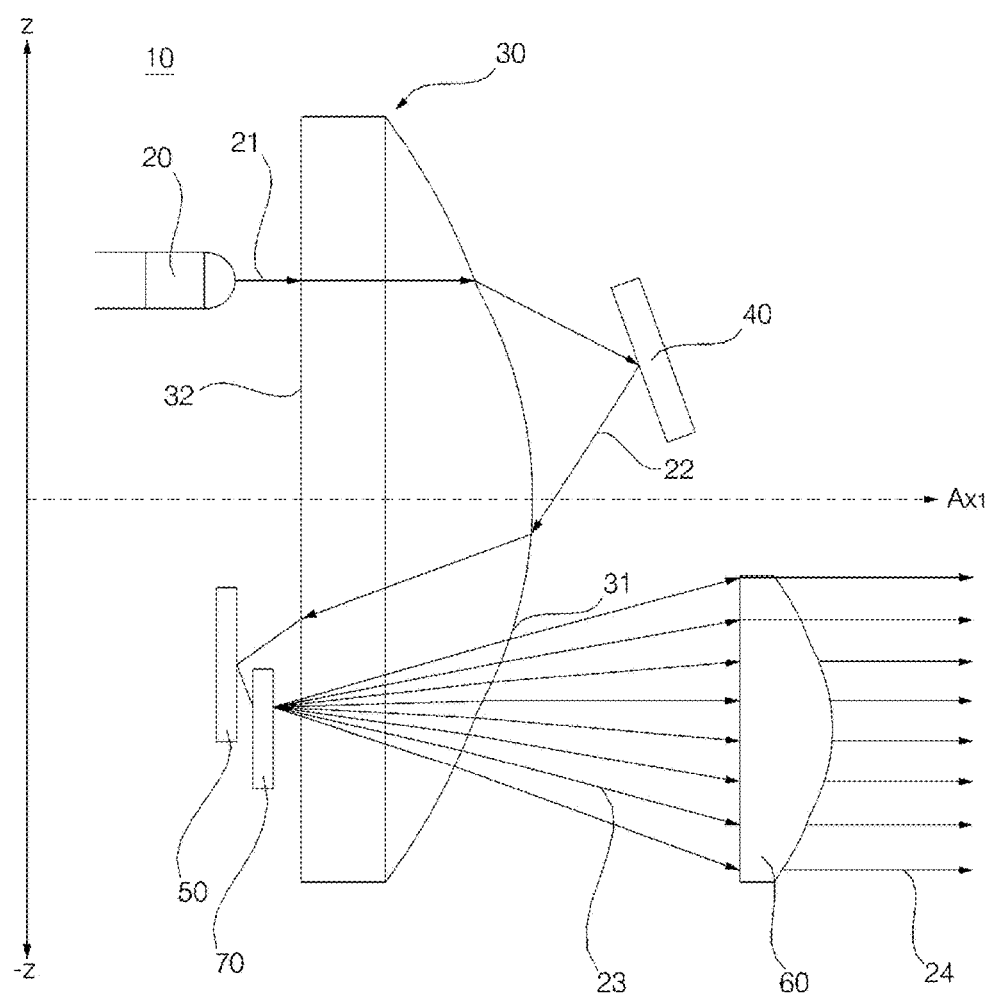
FIG. 2 is a conceptual view illustrating the optical path of a light-emitting module according to an embodiment of the present invention.

Referring to FIGS. 1 and 2, a light-emitting module 10 according to an embodiment of the present invention comprises a condensing lens 30 for concentrating light incident thereinto on a predetermined spot, a light source 20 disposed behind the condensing lens 30 to emit first light 21 toward the condensing lens 30, a first optical path conversion unit 40 disposed in front of the condensing lens 30 to reflect the first light 21, having passed through the condensing lens 30, and supply first reflected light 22 to the condensing lens 30, a second optical path conversion unit 50 disposed behind the condensing lens 30 to reflect the first reflected light 22, having passed through the condensing lens 30, and supply second reflected light 23 to the condensing lens 30, and a wavelength conversion unit 70 for converting the second reflected light 23, incident thereinto, into light having a different wavelength from that of the second reflected light 23 and emitting the light.

Here, the direction "front" refers to the right side (direction of −Ax1) along a central axis Ax1 and −Ax1 (also referred to as an optical axis) of the condensing lens 30 in FIG. 1. The direction "rear" refers to the left side (direction of −Ax1) along the central axis Ax1 and −Ax1 of the condensing lens 30 in FIG. 1.

The central axis Ax1 of the condensing lens 30 is an imaginary line which connects the focal point of a front surface 31 of the condensing lens 30 with the center of the condensing lens 30.

The condensing lens 30 functions to concentrate light incident from the rear of the optical axis on a predetermined spot in the front of the optical axis. The condensing lens 30 refracts the incident light due to the shape of the condensing lens 30 and the difference in refractive index between the condensing lens 30 and the outside. The refractive index of the condensing lens 30 may be greater than 1, and preferably, may range from 1.5 to 1.6.

For example, the condensing lens 30 includes a spherical lens or a non-spherical lens. Preferably, the condensing lens 30 may be embodied as a non-spherical lens.

The condensing lens 30 may have a shape that is convex in the front direction of the optical axis Ax. In another example, the condensing lens 30 may include a rear surface 32 which is perpendicular to the central axis Ax1 of the condensing lens 30, and a front surface 31 which is formed to be convex in the front direction of the condensing lens 30. Alternatively, the rear surface 32 may be formed to be concave in the front direction of the optical axis.

The front surface 31 of the condensing lens 30 is formed in a curve shape having a peak which lies on the central axis Ax1 of the condensing lens 30. In detail, the front surface 31 of the condensing lens 30 may be formed in a curve shape which has a focal point on the central axis Ax1 of the condensing lens 30 and multiple radii of curvature.

The condensing lens 30 refracts light that is incident parallel to the central axis Ax1 of the condensing lens 30, and concentrates the light on a predetermined spot in the front region of the optical axis. The condensing lens 30 may be made of various materials that light can penetrate.

The light source 20 functions to generate light by receiving electrical energy and converting the electrical energy into optical energy. For example, the light source 20 may be embodied as an ultra-high voltage (UHV) mercury lamp, a light-emitting diode (LED), a laser diode (LD) or the like. Preferably, the light source 20 may be embodied as a laser diode having good light straightness and convergence.

Various power supplies may supply power to the light source 20. The power may be supplied by a printed circuit board (PCB), a metal core PCB, a flexible PCB, a ceramic PCB or the like.

Here, the laser diode is a semiconductor laser having two electrodes for performing laser processes. For example, the laser diode may have a GaAs, $Al_xGa_{1-x}As$ double heterojunction structure.

The light source 20 may generate various colors of light. Preferably, the light source 20 generates blue-based light having good efficiency.

The light source 20 is disposed behind the condensing lens 30, and emits the first light 21 toward the condensing lens 30. The first light 21 is incident parallel to the central axis Ax1 (optical axis) of the condensing lens 30. Here, the term "parallel" does not refer to a parallel state in the mathematical sense, but refers to a substantially parallel state within the allowable range.

The first light 21 is incident into the condensing lens 30 through a point on the rear surface 32 of the condensing lens 30 that is located eccentrically from the central axis Ax1 of the condensing lens 30.

In detail, the condensing lens 30 may be divided into a first region and a second region by an imaginary section cut along the central axis Ax1 of the condensing lens 30.

For example, as shown in FIG. 1, the first region is an upper region (region in the direction of Z-axis) above the central axis Ax1 of the condensing lens 30. The second region is a lower region (region in the direction of −Z-axis) below the central axis Ax1 of the condensing lens 30. In this situation, the first light 21 is incident into the first region of the condensing lens 30.

To achieve this, the light source 20 is located eccentrically from the central axis Ax1 of the condensing lens 30. The light source 20 is spaced apart from the central axis Ax1 of the condensing lens 30 in a first direction (direction of Z-axis) which is perpendicular to the central axis Ax1 of the condensing lens 30. The light source 20 and the second reflection unit 50 are located opposite each other across the central axis Ax1 of the condensing lens 30.

The first light 21 generated from the light source 20 is incident on a point that is eccentric from the central axis Ax1 of the condensing lens 30, is refracted from the front surface 31 of the condensing lens 30, and is then incident on the first reflection unit 40.

The first reflection unit 40 is disposed in front of the condensing lens 30, reflects the first light 21 having passed through the condensing lens 30, and supplies the first reflected light 22 to the condensing lens 30.

In detail, the first reflection unit 40 is arranged so that the first reflected light 22 can pass through the condensing lens 30 from the front surface 31 to the rear surface 32 thereof. The first reflection unit 40 may include a planar surface or a curved surface. According to the number of light sources 20, a plurality of first reflection units 40 may be arranged in a stair shape. Further, the first reflection unit 40 may be rotatably structured so as to adjust the angle of the first reflected light 22.

In greater detail, in order to effectively arrange the components in the limited space of the lamp device for vehicles and increase the efficiency thereof, the first reflection unit 40 is arranged so that the first reflected light 22 is incident into the condensing lens 30 through a point on the front surface 31 of the condensing lens 30 that is located eccentrically from the central axis Ax1 of the condensing lens 30. At this time, it is preferable that the first reflected light 22 is incident into the second area of the condensing lens 30.

The spot of incidence of the front surface 31 of the condensing lens 30, on which the first reflected light 22 is incident, is located apart from the central axis Ax1 of the condensing lens 30 in a second direction. In other words, the first reflected light 22 is incident into another region of the condensing lens 30, which is symmetrical to the region of the condensing lens 30 into which the first light 21 is incident.

If the first reflection unit 40 is disposed on the central axis Ax1 of the condensing lens 30, it has a shortcoming in that the distance between the first reflection unit 40 and the light source is increased, and thus the overall length of the light-emitting module 10 is increased. Therefore, it is preferable that the first reflection unit 40 is disposed at a position spaced apart from the central axis Ax1 of the condensing lens 30 in the first direction (direction of Z-axis) which is perpendicular to the central axis Ax1 of the condensing lens 30.

For example, the first reflection unit 40 includes a reflection layer which has a reflection surface intersecting the optical axis. Here, the reflection layer may be made from a material having a good reflection property, for example, a material selected from the group consisting of Ag, Ni, Al, Rh, Pd, Ir, Ru, Mg, Zn, Pt, Au, Hf and a combination thereof.

The reflection layer may have a structure in which a plurality of layers having different refractive indexes are alternately stacked.

The second reflection unit 50 is disposed behind the condensing lens 30, reflects the first reflected light 22 having passed through the condensing lens 30, and supplies the second reflected light 23 to the condensing lens 30.

The second reflection unit 50 may function only to reflect the light, or to convert a wavelength of the light while reflecting the light. For example, the second reflection unit 50 may convert the wavelength of the blue-based light emitted from the light source 20 and generate white-based light. The detailed structure of the second reflection unit 50 will be described later. According to the purpose of the light-emitting module 10, the second reflection unit 50 may be structured only to reflect the light, or to convert the wavelength of the light during the reflection. Accordingly, the second reflected light 23 reflected from the second reflection unit 50 may have a wavelength that is different from that of the first reflected light 22.

The second reflection unit 50 is disposed behind the condensing lens 30, and supplies the second reflected light 23 to the condensing lens 30.

The first reflected light 22, which is incident on the front surface 31 of the condensing lens 30 from the first reflection unit 40, is refracted at the boundary surfaces of the condensing lens 30, and is radiated from the rear surface 32 of the second region of the condensing lens 30. The first reflected light 22, having passed through the condensing lens 30, is incident on the second reflection unit 50, and is reflected as the second reflected light 23 from the second reflection unit 50. The second reflected light 23 is incident on a region of the rear surface 32 that is eccentric from the central axis Ax1 of the condensing lens 30. In detail, the second reflected light 23 is incident on the second region of the rear surface 32 of the condensing lens 30.

The reflection property of light will now be described.

Light may be specularly reflected or diffusely reflected based on the surface property of the reflector.

Diffuse reflection may include Gaussian reflection, Lambertian reflection and mixed reflection.

In general, specular reflection is reflection in which, when light is incident on a point of the reflector, an angle between a normal line passing the point and an optical axis of the incident light is equal to an angle between the normal line and an optical axis of reflected light.

Gaussian reflection is reflection in which intensity of reflected light based on an angle at the surface of the reflector and an angle between a normal line and the reflected light vary according to values of a Gaussian function.

Lambertian reflection is reflection in which intensity of reflected light based on an angle at the surface of the reflector and an angle between a normal line and the reflected light vary according to values of a cosine function.

The mixed reflection includes at least one selected from among specular reflection, Gaussian reflection and Lambertian reflection.

In one embodiment, the first reflection unit 40 specularly reflects light for light focusing. In the case in which the second reflection unit 50 functions only to reflect light, the second reflection unit 50 specularly reflects light.

In another embodiment, in the case in which the second reflection unit 50 is configured to perform both reflection and wavelength conversion, the second reflection unit 50 has a structure including a reflection layer and a phosphor layer coated on the reflection layer. When the second reflection unit 50 performs reflection and wavelength conversion, the second reflected light 23 from the second reflection unit 50 undergoes Lambertian reflection or mixed reflection. Accordingly, when the second reflection unit 50 performs reflection and wavelength conversion, the second reflected light 23 is radiated ahead of the optical axis Ax. In other words, the second reflected light 23 becomes fan-shaped light which is directed at a predetermined angle in upper and lower directions based on an arbitrary line parallel to the central axis Ax1 of the condensing lens 30.

Preferably, the reflection surface of the second reflection unit 50 is arranged perpendicular to the central axis Ax1 of the condensing lens 30.

The second reflected light 23 is incident on the second region of the rear surface 32 of the condensing lens 30, is refracted at the boundary surfaces of the condensing lens 30, and is radiated from the condensing lens 30. The second reflected light 23 having passed through the condensing lens 30 has a smaller radiation angle than the second reflected light 23 that is incident into the condensing lens 30.

Accordingly, the second reflected light 23 having passed through the condensing lens 30 is diffused while having a certain degree of straightness. Such second reflected light 23 may be used as a low beam in a lamp device for vehicles, which illuminates a region spaced apart by a short distance.

The second reflection unit 50 is disposed at a position spaced apart from the central axis Ax1 of the condensing lens 30 in the second direction (direction of −Z-axis) which is perpendicular to the central axis Ax1 of the condensing lens 30. The second reflection unit 50 is located opposite the light source 20 across the central axis Ax1 of the condensing lens 30.

In a further embodiment, the second reflected light 23 may be converted into light that is substantially parallel to the optical axis so as to be used as a high beam for illuminating a region spaced apart by a long distance. In this case, the light-emitting module according to this embodiment may further comprise an auxiliary condensing lens 60 for concentrating the second reflected light 23 having passed through the condensing lens 30 on a predetermined spot in the front.

The auxiliary condensing lens 60 functions to concentrate light incident from the rear of the optical axis on a predetermined spot in the front of the optical axis. The auxiliary condensing lens 60 refracts the incident light due to the shape of the auxiliary condensing lens 60 and the difference in refractive index between the auxiliary condensing lens 60 and the outside. The refractive index of the auxiliary condensing lens 60 may be greater than 1, and preferably, may range from 1.5 to 1.6.

For example, the auxiliary condensing lens 60 includes a spherical lens or a non-spherical lens. Preferably, the auxiliary condensing lens 60 may be embodied as a non-spherical lens.

The auxiliary condensing lens 60 may have a shape that is convex in the front direction of the optical axis Ax1. In another example, the auxiliary condensing lens 60 may include a rear surface which is perpendicular to a central axis Ax2 of the auxiliary condensing lens 60, and a front surface which is formed to be convex in the front direction of the auxiliary condensing lens 60. Alternatively, the rear surface may be formed to be concave in the front direction of the optical axis.

The central axis Ax2 of the auxiliary condensing lens 60 is eccentric from the central axis Ax1 of the condensing lens 30. In detail, the central axis Ax2 of the auxiliary condensing lens 60 may be located within the second region of the condensing lens 30. Preferably, the central axis Ax2 of the auxiliary condensing lens 60 is parallel to the central axis Ax1 of the condensing lens 30.

The light incident into the auxiliary condensing lens 60 from the rear is refracted at the boundary surfaces of the auxiliary condensing lens 30, and is radiated as light parallel to the optical axis.

The wavelength conversion unit 70 functions to convert the wavelength of the second reflected light 23 incident thereinto. For example, the wavelength conversion unit 70 may convert the wavelength of the blue-based light emitted from the light source 20 and generate white-based light.

The wavelength conversion unit 70 may include a well-known phosphor for converting the wavelength of light. The detailed structure of the wavelength conversion unit 70 will be described later.

After passing through the wavelength conversion unit 70, the second reflected light 23 is incident into the condensing lens 30 or/and the auxiliary condensing lens 60. In an example, as shown in FIG. 1, the wavelength conversion unit 70 is disposed between the condensing lens 30 and the second optical path conversion unit 50. The wavelength conversion unit 70 receives the second reflected light 23, radiated from the second optical path conversion unit 50, and supplies the second reflected light 23 to the second region of the condensing lens 30.

In particular, the wavelength conversion unit 70 is decentered with respect to the central axis Ax1 of the condensing lens 30, and is located opposite to the light source 20. The wavelength conversion unit 70 is located near the second region.

The second reflected light 23 from the wavelength conversion unit 70 is radiated in the forward direction of the optical axis Ax. In other words, the second reflected light 23, radiated from the wavelength conversion unit 70, becomes fan-shaped light, which is directed at a predetermined angle in upper and lower directions with respect to an arbitrary line parallel to the central axis Ax1 of the condensing lens 30.

Preferably, the reflecting surface of the second optical path conversion unit 50 is arranged to cross or to be perpendicular to the central axis Ax1 of the condensing lens 30.

The second reflected light 23 is incident on the second region of the rear surface 32 of the condensing lens 30, is refracted at the boundary surfaces of the condensing lens 30, and is radiated from the condensing lens 30. The second reflected light 23 that has passed through the condensing lens 30 has a smaller angle of radiation than the second reflected light 23 that is incident into the condensing lens 30.

Accordingly, the second reflected light 23 that has passed through the condensing lens 30 is diffused while having a certain degree of straightness. Such second reflected light 23 may be used as a low beam in a lamp device for vehicles, which illuminates a short-distance region.

The second optical path conversion unit 50 is disposed at a position spaced apart from the central axis Ax1 of the condensing lens 30 in the second direction (direction of −Z-axis), which is perpendicular to the central axis Ax1 of the condensing lens 30. The second optical path conversion unit 50 and the light source 20 are located opposite to each other across the central axis Ax1 of the condensing lens 30.

Figure 3:
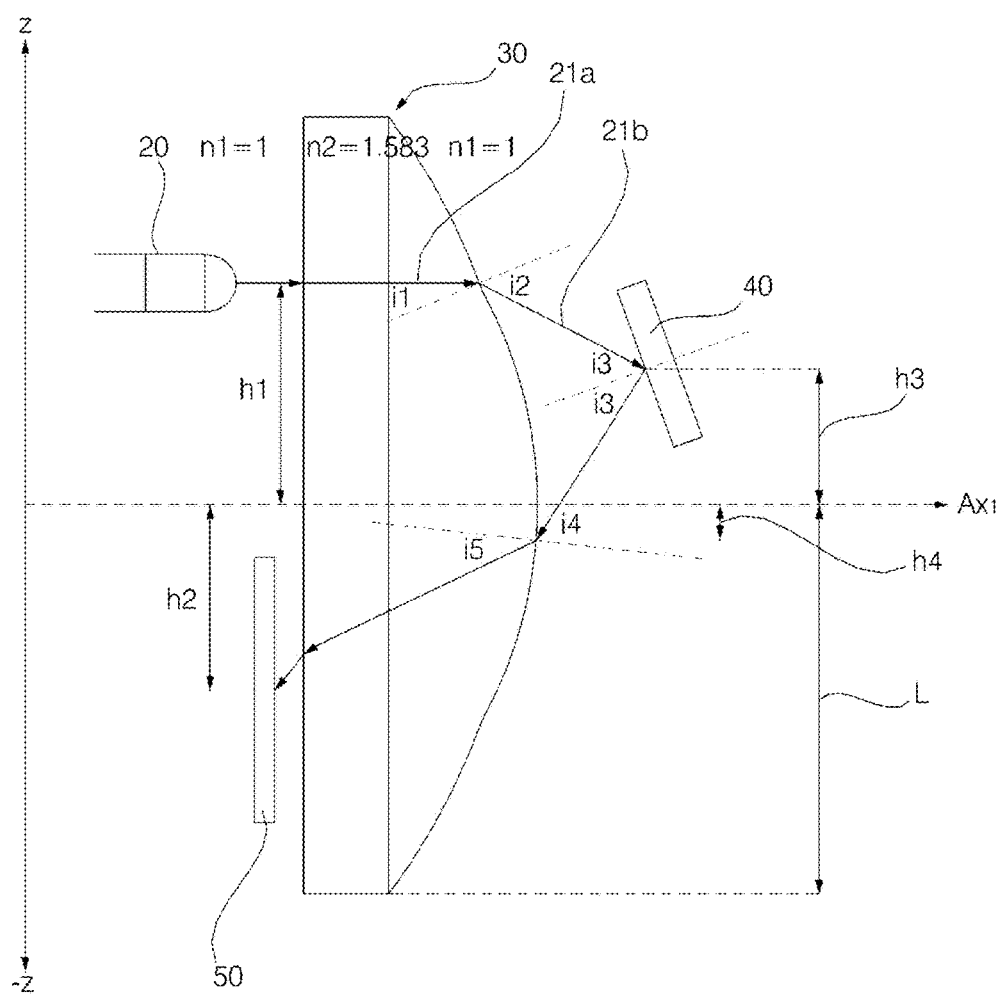
FIGS. 3 and 4 are reference views for explaining refraction and reflection of a light-emitting module according to an embodiment of the present invention.
Figure 4:
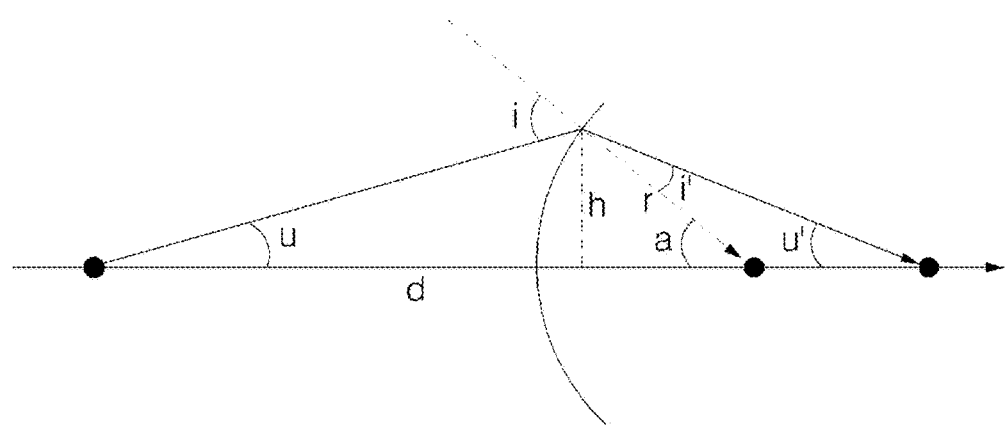

FIGS. 3 and 4 are reference views for explaining refraction and reflection of the light-emitting module 10 according to an embodiment of the present invention.

First, referring to FIG. 4, Snell's law related to light refraction is as follows.

$$n \sin i = n' \sin i'$$

A refraction formula is deduced by transforming Snell's law as follows.

$$ni \cong n'i'$$
$$n(\alpha - u) = n'(\alpha - u')$$
$$n\left(\frac{h}{r} - u\right) = n'\left(\frac{h}{r} - u'\right)$$
$$n'u' = nu + \frac{h}{r}(n' - n)$$

Here, n refers to a refractive index of a medium before refraction, n' refers to a refractive index of the medium after refraction, i refers to an angle between a plane onto which light is incident and a vertical plane, and i' refers to an angle between radiated light and the vertical plane.

Using the above refraction formula, a distance h of each component from the central axis Ax1 of the condensing lens 30 can be calculated as follows.

$$n'u' = nu + \frac{h}{r}(n' - n) \Rightarrow h = \frac{r(n'u' - nu)}{(n' - n)}$$

Here, r refers to a radius of curvature of the lens.

The condensing lens 30 in this embodiment is embodied as a non-spherical lens, in which a radius of curvature of a center portion is smaller than that of an edge portion.

When observed from the front of the central axis Ax1 of the condensing lens 30, the light source 20, the first reflection unit 40 and the second reflection unit 50 are disposed at positions that overlap the condensing lens 30. Therefore, the housing accommodating the light-emitting module 10 may be reduced to the size of the condensing lens 30.

In detail, a first distance h1 between the central axis Ax1 of the condensing lens 30 and the light source 20 is smaller than a radius L of the condensing lens 30. Here, the first distance h1 is calculated using the above-mentioned distance calculation formula.

A second distance h2 between the central axis Ax1 of the condensing lens 30 and the second reflection unit 50 is smaller than the radius L of the condensing lens 30. Of course, the second distance h2 is also calculated using the above-mentioned distance calculation formula. The second reflection unit 50 is located behind the condensing lens 30, and more precisely, at a position adjacent to the rear surface 32 of the condensing lens 30.

Preferably, the first distance h1 of the light source 20 and the second distance h2 of the second reflection unit 50 may be equal. More preferably, a ratio of the first distance h1 to the second distance h2 may be in the range of 1:0.7 to 1:1.1. Much more preferably, the ratio of the first distance h1 to the second distance h2 may be in the range of 1:0.94 to 1:0.98.

A third distance h3 between the central axis Ax1 of the condensing lens 30 and the first reflection unit 40 is greater than 0 and smaller than the radius L of the condensing lens 30. Of course, the third distance h3 is also calculated using the above-mentioned distance calculation formula.

A fourth distance h4 between the central axis Ax1 of the condensing lens 30 and the spot of incidence of the first reflected light 22 may be smaller than the first distance h1 or the second distance h2. Preferably, a ratio of the first distance h1 of the light source 20 to the fourth distance h4 of the spot of incidence may be in the range of 1:0.1 to 1:0.6. More preferably, the ratio of the first distance h1 of the light source 20 to the fourth distance h4 of the spot of incidence may be in the range of 1:0.35 to 1:0.37.

For convenience of assembly, the light-emitting module 10 is generally accommodated in a hexahedron-shaped housing. By disposing the light source 20 at the upper portion behind the condensing lens 30 and disposing the second reflection unit 50 at the lower portion behind the condensing lens 30, the length of the light-emitting module 10 may be reduced, and space utilization may be maximized. As a result, the light-emitting module 10 may be easily accommodated in the housing.

Further, by disposing the auxiliary condensing lens 60 at the lower portion in front of the condensing lens 30 and disposing the first reflection unit 40 at the upper portion in front of the condensing lens 30, the length of the light-emitting module 10 may be reduced, and space utilization may be maximized, so that the light-emitting module 10 can be easily accommodated in the housing.

Figure 5A:
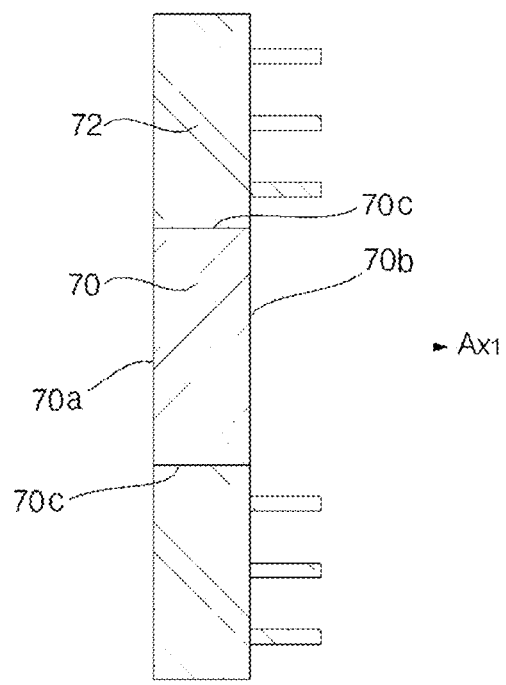
FIG. 5A is a sectional view of a wavelength conversion unit according to an embodiment of the present invention.
Figure 5B:
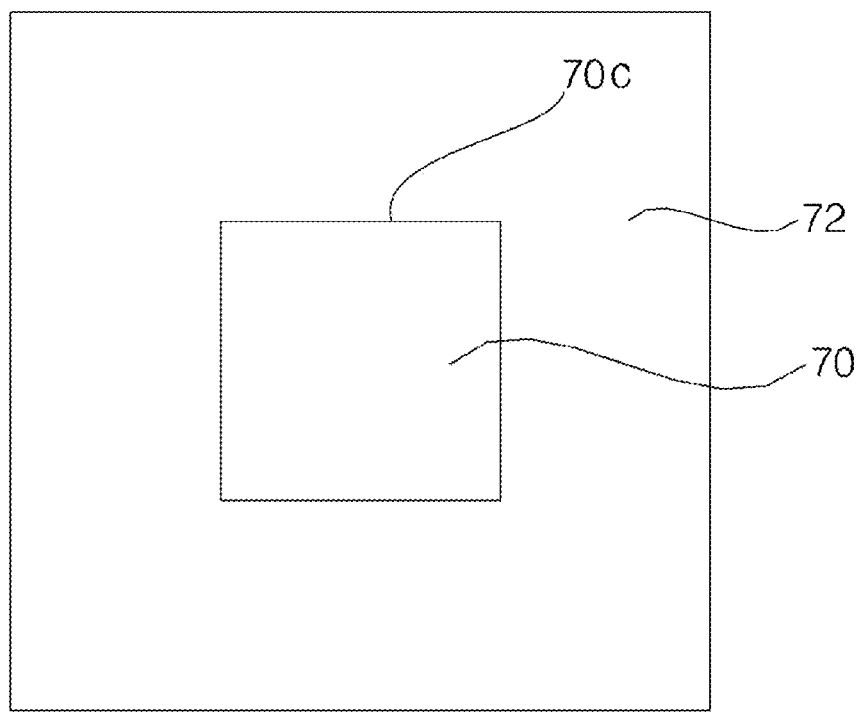
FIG. 5B is a plan view of a wavelength conversion unit according to an embodiment of the present invention when viewed from the front of an optical axis.

FIG. 5A is a sectional view of the wavelength conversion unit according to an embodiment of the present invention, and FIG. 5B is a plan view of the wavelength conversion unit according to an embodiment of the present invention when viewed from the front of the optical axis.

Referring to FIG. 5B, the wavelength conversion unit 70 may have a structure in which phosphors (not shown) are spread on a base layer, such as transparent silicon or the like. The kind of phosphor may be determined based on the wavelength of the light emitted from the light source 20 such that the light-emitting module 10 emits white light.

Based on the wavelength of the light emitted from the light source 20, the phosphor may be embodied as one of a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor.

In detail, when the light source 20 is a blue laser diode and the phosphor (not shown) is a yellow phosphor, the yellow phosphor may emit yellow light by being excited by blue light, and the blue light from the blue laser diode and the yellow light generated by excitation by the blue light are mixed. As a result, the light-emitting module 10 may emit white light.

The wavelength conversion unit 70 includes an incidence surface 70a, a radiation surface 70b, and side surfaces 70c. The incidence surface 70a of the wavelength conversion unit 70 is the surface on which the second reflected light 23 is incident. The radiation surface 70b of the wavelength conversion unit 70 is arranged opposite to the incidence surface 70a. The radiation surface 70b is the surface from which the second reflected light 23, which was incident on the incidence surface 70a, is radiated. The side surfaces 70c are the surfaces that connect the incidence surface 70a and the radiation surface 70b. Each of the side surfaces 70c has a smaller area than the incidence surface 70a and the radiation surface 70b.

The incidence surface 70a and the radiation surface 70b of the wavelength conversion unit 70 are arranged so as to cross the central axis Ax1 of the condensing lens 30. The wavelength conversion unit 70 further includes a heat sink for dissipating heat.

The heat sink is disposed in contact with the side surfaces 70c of the wavelength conversion unit 70 so as not to block the light passing through the wavelength conversion unit 70. The heat sink has a space in which the wavelength conversion unit 70 is located, and is arranged to surround the wavelength conversion unit 70.

Figure 6A:
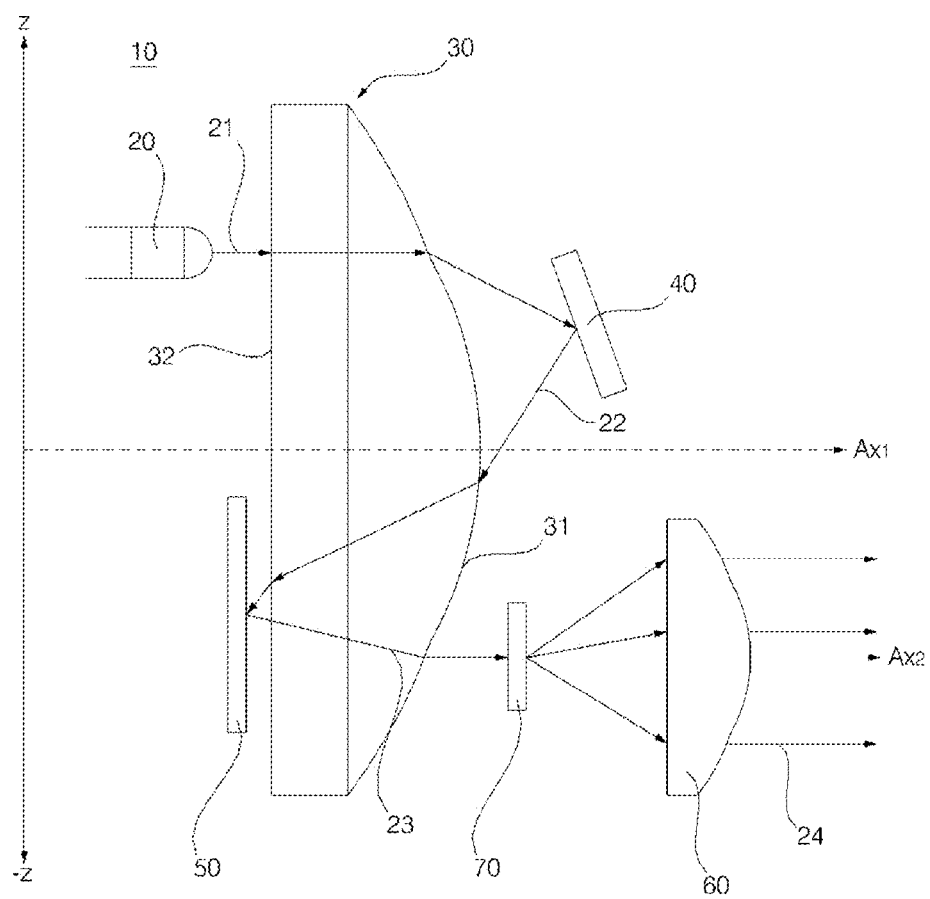
FIG. 6A is a conceptual view of a light-emitting module according to another embodiment of the present invention.

FIG. 6A is a conceptual view of a light-emitting module according to another embodiment of the present invention.

Referring to FIG. 6A, the light-emitting module according to this embodiment and the light-emitting module according to the embodiment shown in FIG. 1 differ as to the position of the wavelength conversion unit 70.

The wavelength conversion unit 70 in the light-emitting module according to another embodiment may be located between the condensing lens 30 and the auxiliary condensing lens 60. The wavelength conversion unit 70 receives the second reflected light 23 from the condensing lens 30 and supplies the second reflected light 23 to the auxiliary condensing lens 60. The second reflected light 23, radiated from the second optical path conversion unit 50, is incident into the condensing lens 30, and the second reflected light 23, radiated from the condensing lens 30, is incident into the wavelength conversion unit 70. The light radiated from the wavelength conversion unit 70 is incident into the auxiliary condensing lens 60.

In particular, the wavelength conversion unit 70 is decentered with respect to the central axis Ax1 of the condensing lens 30, and is located opposite to the light source 20. The wavelength conversion unit 70 is located near the second region. The wavelength conversion unit 70 is located in front of the condensing lens 30.

Figure 6B:
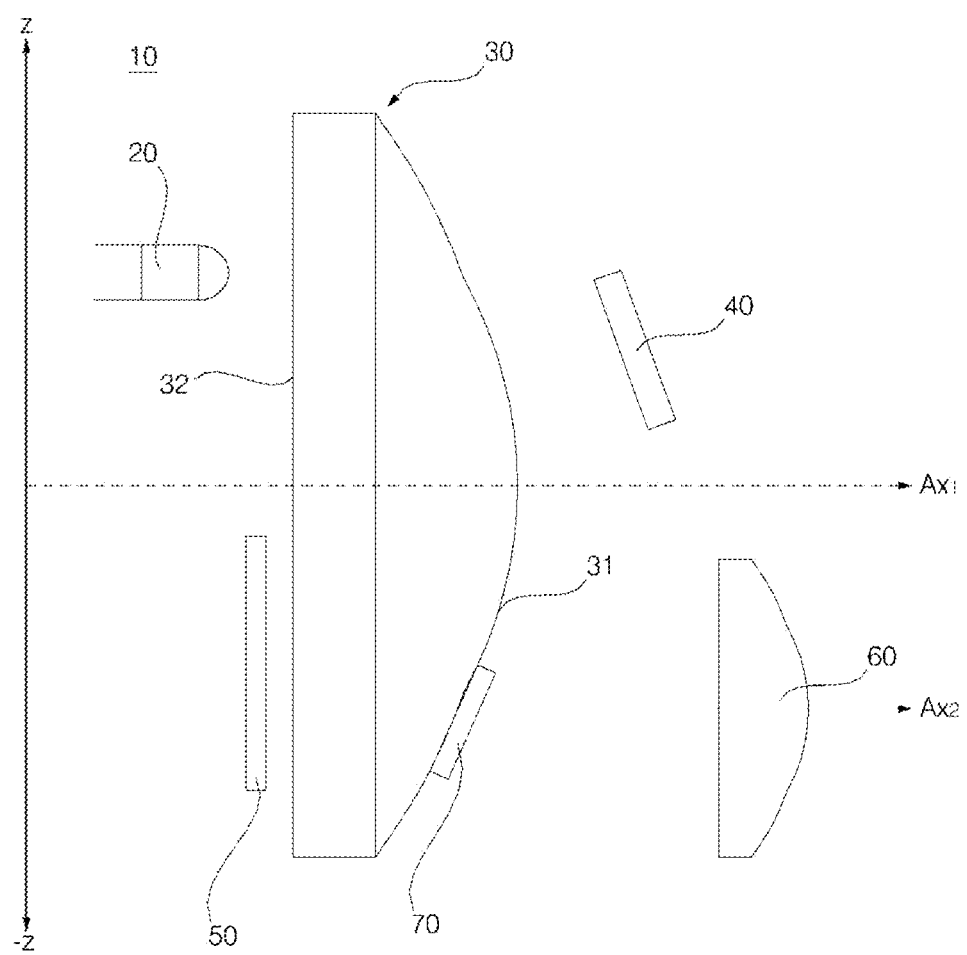
FIG. 6B is a conceptual view of a light-emitting module according to a further embodiment of the present invention.

FIG. 6B is a conceptual view of a light-emitting module according to a further embodiment of the present invention.

Referring to FIG. 6B, the light-emitting module according to this embodiment and the light-emitting module according to the embodiment shown in FIG. 1 differ as to the position of the wavelength conversion unit 70.

The wavelength conversion unit 70 in the light-emitting module according to a further embodiment may be located on one surface of the condensing lens 30. Particularly, the wavelength conversion unit 70 is coated on the front surface or the rear surface of the condensing lens 30. More particularly, the wavelength conversion unit 70 is coated on the front surface of the condensing lens 30.

The wavelength conversion unit 70 receives the second reflected light 23 from the condensing lens 30 and supplies the second reflected light 23 to the auxiliary condensing lens 60. The second reflected light 23, radiated from the second optical path conversion unit 50, is incident into the condensing lens 30, and the second reflected light 23, radiated from the condensing lens 30, is incident into the wavelength conversion unit 70. The light radiated from the wavelength conversion unit 70 is incident into the auxiliary condensing lens 60.

In particular, the wavelength conversion unit 70 is decentered with respect to the central axis Ax1 of the condensing lens 30, and is located opposite to the light source 20. The wavelength conversion unit 70 is located near the second region. The wavelength conversion unit 70 is located on the front surface of the condensing lens 30.

Figure 7A:
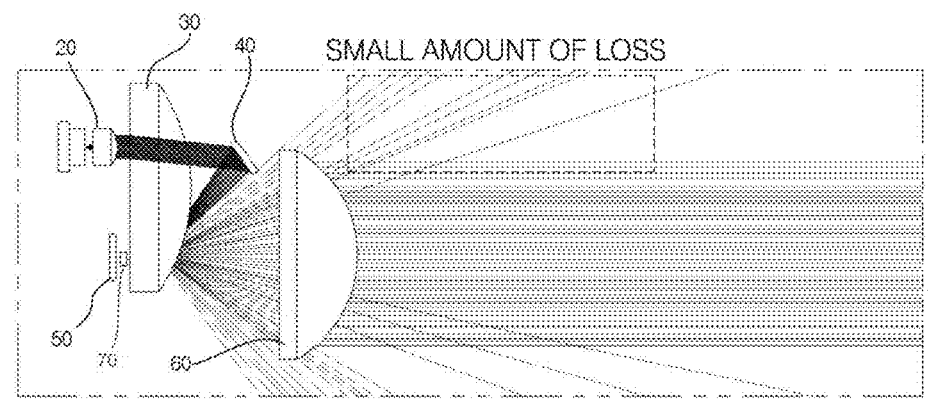
FIGS. 7A and 7B are views illustrating an optical path and a projection image of a light-emitting module according to the present invention.
Figure 7B:
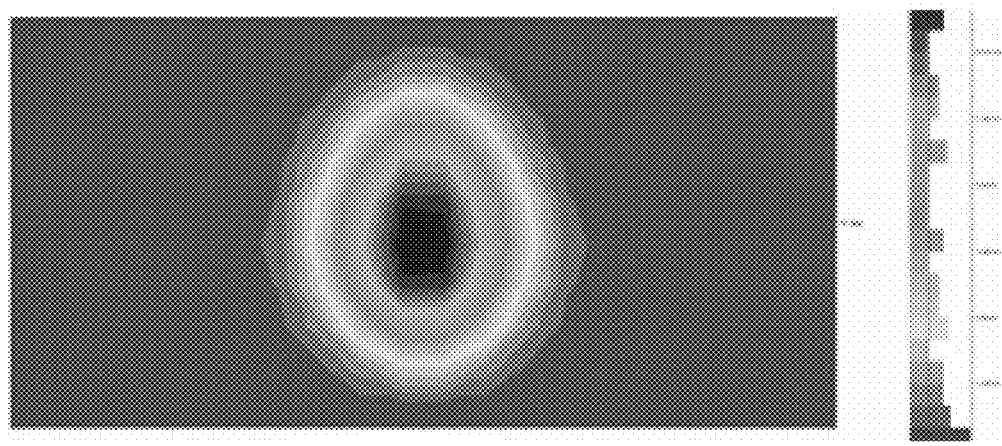

FIGS. 7A and 7B are views illustrating an optical path and a projection image of the light-emitting module 10 according to the present invention.

Referring to FIG. 7A, the first light 21 generated from the light source 20 is incident into the upper region (first region) of the condensing lens 30, is refracted, and is radiated from the condensing lens 30. The first light 21 radiated from the condensing lens 30 is incident on the first reflection unit 40.

The first light 21 incident on the first reflection unit 40 is reflected therefrom, and is radiated as the first reflected light 22. The first reflected light 22 is incident into the lower region (second region) of the condensing lens 30. The first reflected light 22 is radiated rearward through the lower region of the condensing lens 30.

The first reflected light 22 radiated from the condensing lens 30 is incident on the second reflection unit 50. The first reflected light 22 is converted into white light at the second reflection unit 50 by wavelength conversion, is reflected from the second reflection unit 50, and is radiated as the second reflected light 23.

At this time, since the second reflected light 23 undergoes Lambertian reflection, the second reflected light 23 becomes fan-shaped light which is directed at a predetermined angle based on an arbitrary line parallel to the optical axis.

The second reflected light 23 is incident into the lower region of the condensing lens 30, is refracted, and is radiated ahead of the condensing lens 30.

The second reflected light 23 radiated from the condensing lens 30 is concentrated by the auxiliary condensing lens 60, and is radiated as the second light 24.

The majority of the second reflected light 23 is incident into the auxiliary condensing lens 60, and is refracted to be parallel light.

From FIG. 7B, illustrating a projection image at 20 meters ahead of the light source 20, it can be known that the majority of the light is concentrated on a small region.

Figure 8:
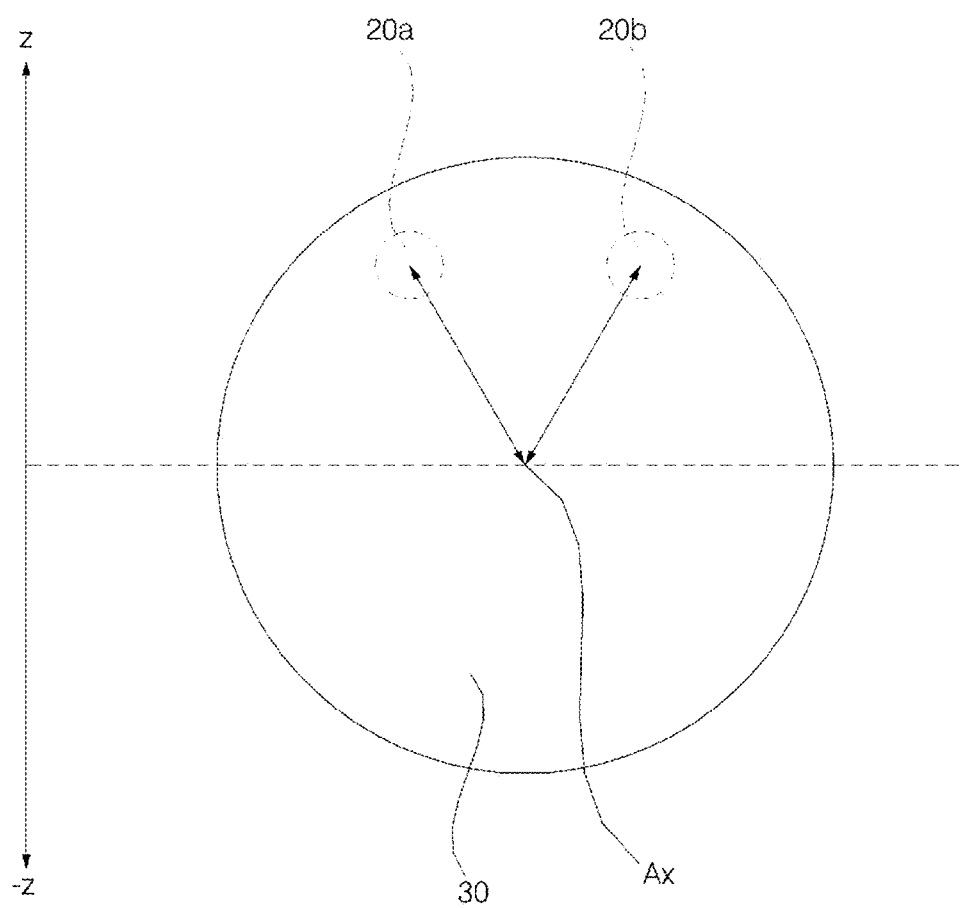
FIG. 8 is a conceptual view of a light-emitting module according to another embodiment of the present invention.

FIG. 8 is a conceptual view of a light-emitting module according to another embodiment of the present invention.

Referring to FIG. 8, the number of light sources 20 in the light-emitting module 10 according to another embodiment is different from that in the light-emitting module of the previous embodiment, shown in FIG. 1.

Figure 9A:
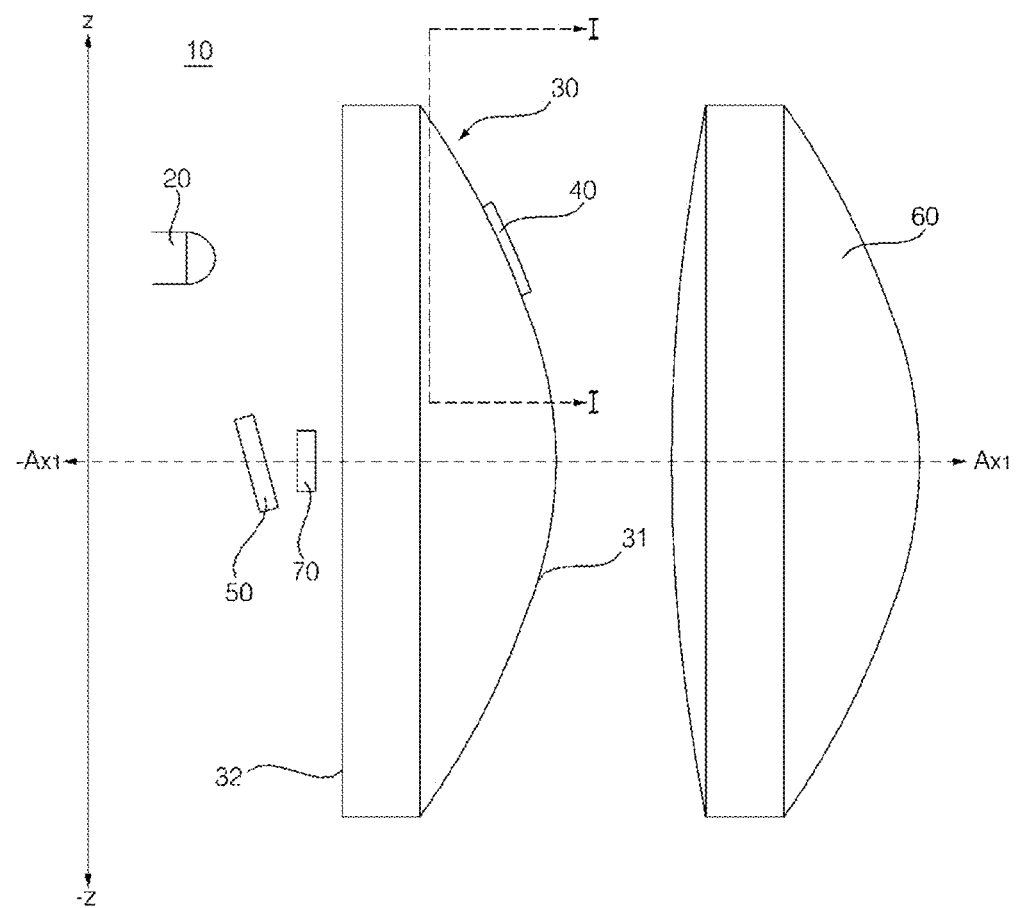
FIGS. 9A and 9B are conceptual views of a light emitting module according to another embodiment of the present invention when viewed in different directions.
Figure 9B:
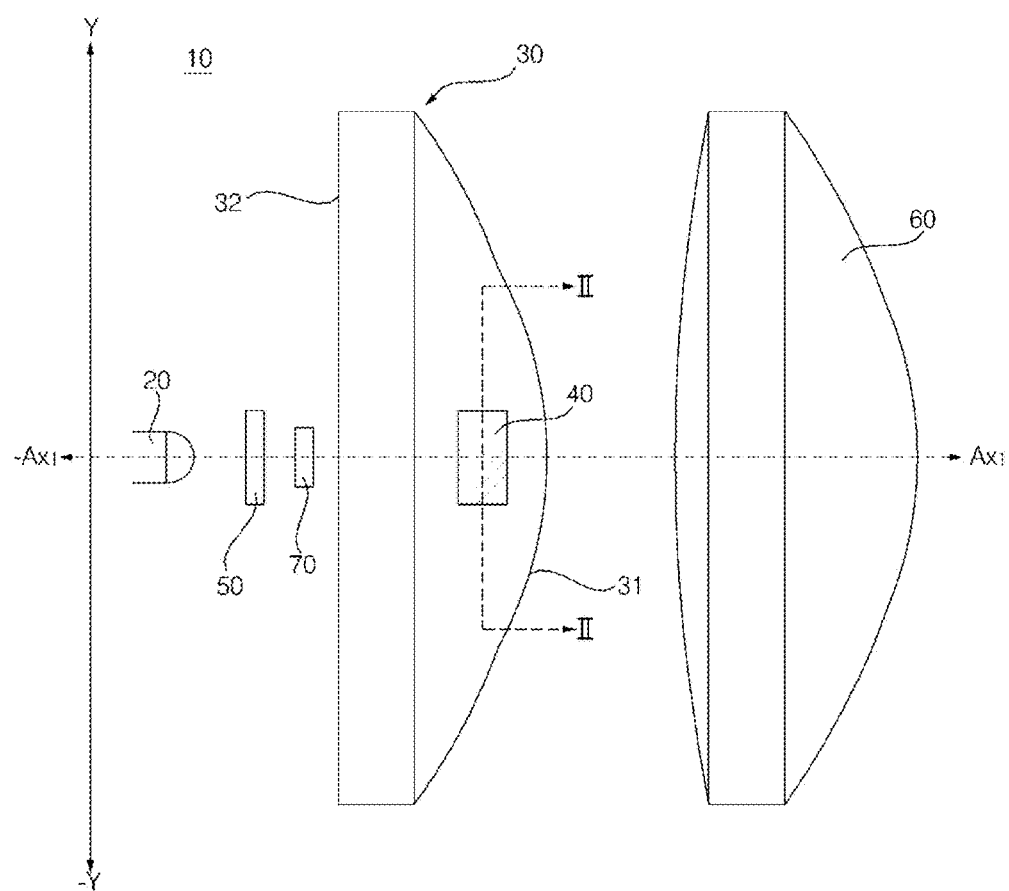
Figure 10:
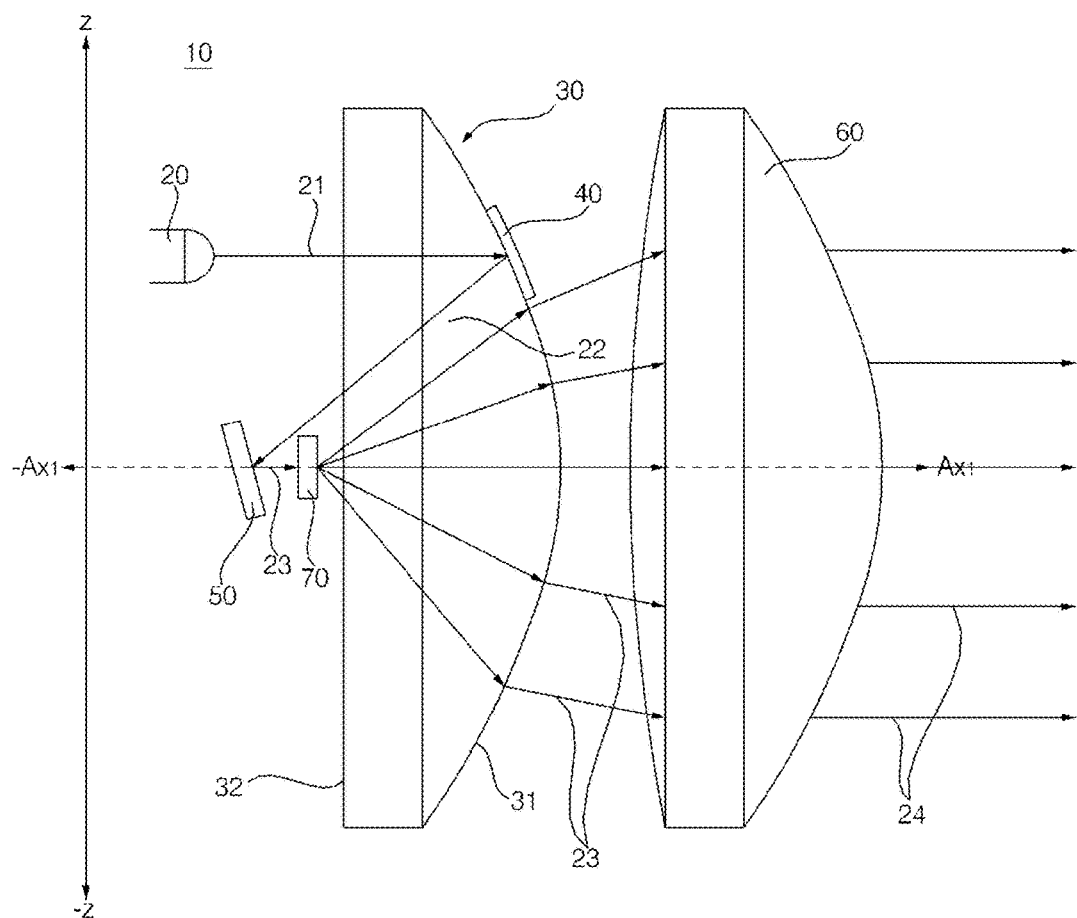
FIG. 10 is a conceptual view illustrating an optical path of the light emitting module according to the embodiment of the present invention.

FIGS. 9A and 9B are conceptual views of a light emitting module according to another embodiment of the present invention when viewed in different directions, and FIG. 10 is a conceptual view illustrating an optical path of the light emitting module according to the embodiment of the present invention.

Referring to FIGS. 9 and 10, a light emitting module 10 according to another embodiment of the present invention includes a condensing lens 30 for condensing incident light into a space, a light source 20 disposed at one side of the condensing lens 30 so as to be spaced apart from the condensing lens 30, a first optical path conversion member 40 disposed at the other side of the condensing lens 30, a second optical path conversion member 50 disposed at one side of the condensing lens 30 so as to be spaced apart from the condensing lens 30, the second optical path conversion member 50 also being spaced apart from the light source 20, and a wavelength conversion unit 70 for converting the wavelength of light incident from the second optical path conversion member 50 and radiating light the wavelength of which has been converted.

Specifically, the light emitting module 10 includes a condensing lens 30 for condensing light incident from the rear into a front space, a light source 20 disposed behind the condensing lens 30 for providing first light 21 to pass through the condensing lens 30, a first optical path conversion member 40 disposed in front of the condensing lens 30 for reflecting the first light 21 to provide first reflected light 22 to pass through the condensing lens 30, a second optical path conversion member 50 disposed behind the condensing lens 30 for providing the first reflected light incident thereon as second reflected light 23 to pass through the condensing lens 30, and a wavelength conversion unit 70 for receiving the second reflected light 23, converting the wavelength of the received second reflected light 23, and radiating light the wavelength of which has been converted. In addition, the light emitting module 10 further includes an auxiliary condensing lens 60 disposed in front of the condensing lens 30 for condensing the second reflected light 23 having passed through the condensing lens 30 in the forward direction.

The condensing lens 30 condenses light incident from the rear of an optical axis into a space in front of the optical axis. The condensing lens 30 refracts the incident light due to the shape of the condensing lens 30 and the difference in refractive index between the condensing lens 30 and the outside. The refractive index of the condensing lens 30 may be greater than 1. The refractive index of the condensing lens 30 may range, for example, from 1.5 to 1.6.

The condensing lens 30 refracts light that is incident parallel to a central axis Ax1 of the condensing lens 30, and concentrates the light on an arbitrary spot in front of the optical axis. The condensing lens 30 may be made of various materials that light can penetrate.

The light source 20 generates light by receiving electrical energy and converting the electrical energy into optical energy. For example, the light source 20 may be embodied as an ultra-high voltage (UHV) mercury lamp, a light emitting diode (LED), a laser diode (LD), or the like. Specifically, the light source 20 may be embodied as a laser diode having good light straightness and convergence.

The light source 20 is disposed behind the condensing lens 30 for providing first light 21 to pass through the condensing lens 30. The first light 21 is incident parallel to the central axis Ax1 (optical axis) of the condensing lens 30. Here, the term "parallel" does not refer to a parallel state in the mathematical sense, but refers to a parallel state within the allowable range.

The first light 21 is incident on the rear surface 32 of the condensing lens 30, which is decentered with respect to the central axis Ax1 of the condensing lens 30.

More specifically, the condensing lens 30 may be divided into a first region and a second region by a section cut along the central axis Ax1 of the condensing lens 30.

For example, as shown in FIG. 1, the first region is an upper region (a region in the direction of Z-axis) above the central axis Ax1 of the condensing lens 30. The second region is a lower region (a region in the direction of −Z-axis) below the central axis Ax1 of the condensing lens 30. In this situation, the first light 21 is incident on the first region of the condensing lens 30.

To this end, the light source 20 is located so as to be decentered with respect to the central axis Ax1 of the condensing lens 30. Specifically, the light source 20 is located so as to be decentered with respect to the central axis Ax1 of the condensing lens 30 in the vertical direction (the direction of Z-axis and −Z-axis). Of course, the light source 20 may be located so as to be decentered with respect to the central axis Ax1 of the condensing lens 30 in the horizontal direction (the direction of Y-axis and −Y-axis). Alternatively, the light source 20 may be located so as to overlap the central axis Ax1 of the condensing lens 30 when viewed in the vertical direction.

The light source 20 is spaced apart from the central axis Ax1 of the condensing lens 30 in a first direction (a direction of Z-axis) which is perpendicular to the central axis Ax1 of the condensing lens 30.

The first light 21 generated from the light source 20 is incident on a point that is decentered with respect to the central axis Ax1 of the condensing lens 30, and is then incident on the first optical path conversion member 40 through a front surface 31 of the condensing lens 30.

The first optical path conversion member 40 is disposed on the front surface 31 of the condensing lens 30 for reflecting the first light 21 having passed through the condensing lens 30 to provide first reflected light 22 to pass through the condensing lens 30.

Specifically, the first optical path conversion member 40 is arranged such that the first reflected light 22 can pass through the condensing lens 30 from the front surface 31 to the rear surface 32 thereof. More specifically, the first optical path conversion member 40 is arranged such that the first reflected light 22 is incident on the first region of the front surface 31 of the condensing lens 30, and is then radiated from the first region of the rear surface 32 of the condensing lens 30.

In addition, the first optical path conversion member 40 may include a planar surface or a curved surface. In particular, a plurality of first optical path conversion members 40 may be arranged in a stair shape in response to the number of light sources 20. Furthermore, the first optical path conversion member 40 may be rotatable so as to adjust the angle of the first reflected light 22.

Meanwhile, a spot S formed as the result of the first reflected light 22 being radiated from the rear surface 32 of the condensing lens 30 is spaced apart from the central axis Ax1 of the condensing lens 30 in the first direction. If the first optical path conversion member 40 is disposed on the central axis Ax1 of the condensing lens 30, the distance between the first optical path conversion member 40 and the light source is increased, with the result that the overall length of the light emitting module 10 is increased.

For this reason, the first optical path conversion member 40 is located so as to be decentered with respect to the central axis Ax1 of the condensing lens 30 in the vertical direction (the direction of Z-axis and −Z-axis). Of course, the first optical path conversion member 40 may be located so as to be decentered with respect to the central axis Ax1 of the condensing lens 30 in the horizontal direction (the direction of Y-axis and −Y-axis). Alternatively, the first optical path conversion member 40 may be located so as to overlap the central axis Ax1 of the condensing lens 30 when viewed in the vertical direction. Specifically, the first optical path conversion member 40 and the condensing lens 30 are arranged such that the first optical path conversion member 40 and the condensing lens 30 at least partially overlap each other when viewed from the front of the condensing lens 30.

The first optical path conversion member 40 may be disposed at a position spaced apart from the central axis Ax1 of the condensing lens 30 in the first direction (the direction of Z-axis) which is perpendicular to the central axis Ax1 of the condensing lens 30.

The first optical path conversion member 40 is disposed on the front surface 31 of the condensing lens 30. Specifically, the first optical path conversion member 40 is disposed so as to contact the front surface 31 of the condensing lens 30.

The first optical path conversion member 40 covers a portion of the front surface 31 of the condensing lens 30. Specifically, the first optical path conversion member 40 covers a portion of the first region of the front surface 31 of the condensing lens 30. The area of the first optical path conversion member 40 may be greater than the sectional area of the first light 21 emitted from the light source 20. In addition, the area of the first optical path conversion member 40 may be less than 10% the area of the front surface 31 of the condensing lens 30.

A light emitting module disclosed in a prior application that was filed by the applicant before filing of the present application is problematic in that the first optical path conversion member 40 is disposed in front of the condensing lens 30 in a state in which the first optical path conversion member 40 is spaced apart from the condensing lens 30, whereby the loss of light occurs when light radiated from the condensing lens 30 passes through the air. In addition, the light emitting module disclosed in the prior application has other problems in that a structure for fixing the first optical path conversion member 40 is needed, and light is blocked by the structure for fixing the first optical path conversion member 40, whereby the loss of light occurs.

The light emitting module according to the present invention is configured such that the first optical path conversion member 40 is disposed on the front surface 31 of the condensing lens 30. As a result, the light emitting module according to the present invention has an advantage in that the size of the light emitting module is reduced. In addition, light radiated from the condensing lens 30 does not pass through the air, whereby the loss of light is reduced. Furthermore, no structure for fixing the first optical path conversion member 40 is needed.

The first optical path conversion member 40 is disposed in contact with the front surface 31 of the condensing lens 30. For example, the first optical path conversion member 40 may be coated on the front surface 31 of the condensing lens 30, or may be inserted into a recess formed in the front surface 31 of the condensing lens 30, which will be described hereinafter.

For example, the first optical path conversion member 40 has a reflection surface intersecting an arbitrary line that is parallel to the optical axis. Here, the first optical path conversion member 40 may be made of a material having a good reflection property, for example, a material selected from the group consisting of Ag, Ni, Al, Rh, Pd, Ir, Ru, Mg, Zn, Pt, Au, Hf, and a combination thereof.

The second optical path conversion member 50 is disposed behind the condensing lens 30 for reflecting the first reflected light 22 to provide second reflected light 23 to pass through the condensing lens 30.

The first reflected light 22, which is incident on the front surface 31 of the condensing lens 30 from the first optical path conversion member 40, is refracted at the boundary surfaces of the condensing lens 30, and is radiated from the rear surface 32 of the first region of the condensing lens 30. The first reflected light 22, having passed through the condensing lens 30, is incident on the second optical path conversion member 50, and is reflected as the second reflected light 23 from the second optical path conversion member 50. The second reflected light 23 is incident on the rear surface 32, which is aligned with the central axis Ax1 of the condensing lens 30. The second reflected light 23, which is incident on the condensing lens 30, is refracted at the boundary surfaces of the condensing lens 30, and is radiated to the front through the front surface 31 of the condensing lens 30.

Light emitted from the light source 20 is focused while sequentially passing through the upper half part of the condensing lens 30, the first optical path conversion member 40, the upper half part of the condensing lens 30, the second optical path conversion member 50, and the middle part of the condensing lens 30. The upper half part of the condensing lens 30 is the upper region of the condensing lens 30 on the basis of the central axis Ax1 of the condensing lens 30. The upper half part of the condensing lens 30 is a first region of the condensing lens 30. The lower half part of the condensing lens 30 is the lower region of the condensing lens 30 on the basis of the central axis Ax1 of the condensing lens 30. The lower half part of the condensing lens 30 is a second region of the condensing lens 30. The middle part of the condensing lens 30 is a predetermined region near the central axis Ax1 of the condensing lens 30.

In one embodiment, the first optical path conversion member 40 specularly reflects light for light focusing. The second optical path conversion member 50 specularly reflects light.

The reflection surface of the second optical path conversion member 50 is arranged so as to intersect an arbitrary line that is parallel to the central axis Ax1 of the condensing lens 30. Specifically, the second optical path conversion member 50 is arranged such that the second reflected light 23, provided by the second optical path conversion member 50, is aligned with the central axis Ax1 of the condensing lens 30. That is, the second reflected light 23 passes through the central axis Ax1 of the condensing lens 30. In one embodiment, the second optical path conversion member 50 is disposed on the central axis Ax1 of the condensing lens 30. In another embodiment, however, the second optical path conversion member 50 may be located so as to be decentered with respect to the central axis Ax1 of the condensing lens 30.

The wavelength conversion unit 70 receives the second reflected light 23, converts the wavelength of the received second reflected light 23, and radiates light the wavelength of which has been converted. For example, the wavelength conversion unit 70 may convert the wavelength of blue-based light generated by the light source 20 into white-based light.

The wavelength conversion unit 70 may be formed of a well-known phosphor, which converts the wavelength of light. The details of the wavelength conversion unit 70 will be described hereinafter.

After passing through the wavelength conversion unit 70, the second reflected light 23 is incident on the condensing lens 30 and/or the auxiliary condensing lens 60. For example, as shown in FIG. 1, the wavelength conversion unit 70 is disposed between the condensing lens 30 and the second optical path conversion member 50. The second reflected light 23, radiated from the second optical path conversion member 50, is incident on the middle part of the condensing lens 30 through the wavelength conversion unit 70.

Specifically, the wavelength conversion unit 70 is located on the central axis Ax1 of the condensing lens 30. The second reflected light 23, radiated from the wavelength conversion unit 70, is radiated ahead of the optical axis Ax. That is, the second reflected light 23, radiated from the wavelength conversion unit 70, becomes fan-shaped light which is directed at a predetermined angle in upper and lower directions based on the central axis Ax1 of the condensing lens 30. In other words, the light, radiated from the wavelength conversion unit 70, is incident toward the condensing lens 30 at the rear of the condensing lens 30 and at a point on the central axis Ax1 of the condensing lens 30.

The second reflected light 23 is incident on the rear surface 32 of the condensing lens 30, is refracted at the boundary surfaces of the condensing lens 30, and is radiated from the condensing lens 30. The second reflected light 23 having passed through the condensing lens 30 has a smaller radiation angle than the second reflected light 23 that is incident on the condensing lens 30.

Accordingly, the second reflected light 23 having passed through the condensing lens 30 is diffused while maintaining a certain degree of straightness. Such second reflected light 23 may be used as a low beam in a lamp device for vehicles, which illuminates a region spaced apart only by a short distance.

In another embodiment, the second reflected light 23 may be converted into light that is approximately parallel to the optical axis so as to be used as a high beam for illuminating a region spaced apart by a long distance. In this case, the light emitting module according to this embodiment may further include an auxiliary condensing lens 60 for concentrating the second reflected light 23 having passed through the condensing lens 30 on a predetermined spot in the front.

The auxiliary condensing lens 60 condenses light incident from the rear of the optical axis into a space in front of the optical axis.

The auxiliary condensing lens 60 refracts the incident light due to the shape of the auxiliary condensing lens 60 and the difference in refractive index between the auxiliary condensing lens 60 and the outside. The refractive index of the auxiliary condensing lens 60 may be greater than 1. For example, the refractive index of the auxiliary condensing lens 60 may range from 1.5 to 1.6.

A central axis Ax2 of the auxiliary condensing lens 60 overlaps the central axis Ax1 of the condensing lens 30. Specifically, the auxiliary condensing lens 60 is located so as to overlap the condensing lens 30 when viewed from the front.

The central axis Ax2 of the auxiliary condensing lens 60 is located so as to be parallel to the central axis Ax1 of the condensing lens 30.

The light incident on the auxiliary condensing lens 60 from the rear is refracted at the boundary surfaces of the auxiliary condensing lens 60, and is radiated parallel to the optical axis.

The light, whose wavelength is converted by and which is reflected from the second optical path conversion member 50, is incident on the rear surface 32 of the condensing lens 30 in a state in which the light spreads radially from the central axis of the condensing lens 30, and is then radiated from the front surface 31 of the condensing lens 30. At this time, the radiation angle of the light radiated from the front surface 31 of the condensing lens 30 is smaller than the radiation angle of the light incident on the rear surface 32 of the condensing lens 30. The light radiated from the front surface 31 of the condensing lens 30 is incident on the auxiliary condensing lens 60, which efficiently converts the light into light parallel to the optical axis. The auxiliary condensing lens 60 may be made of the same material as the condensing lens 30.

Figure 11:
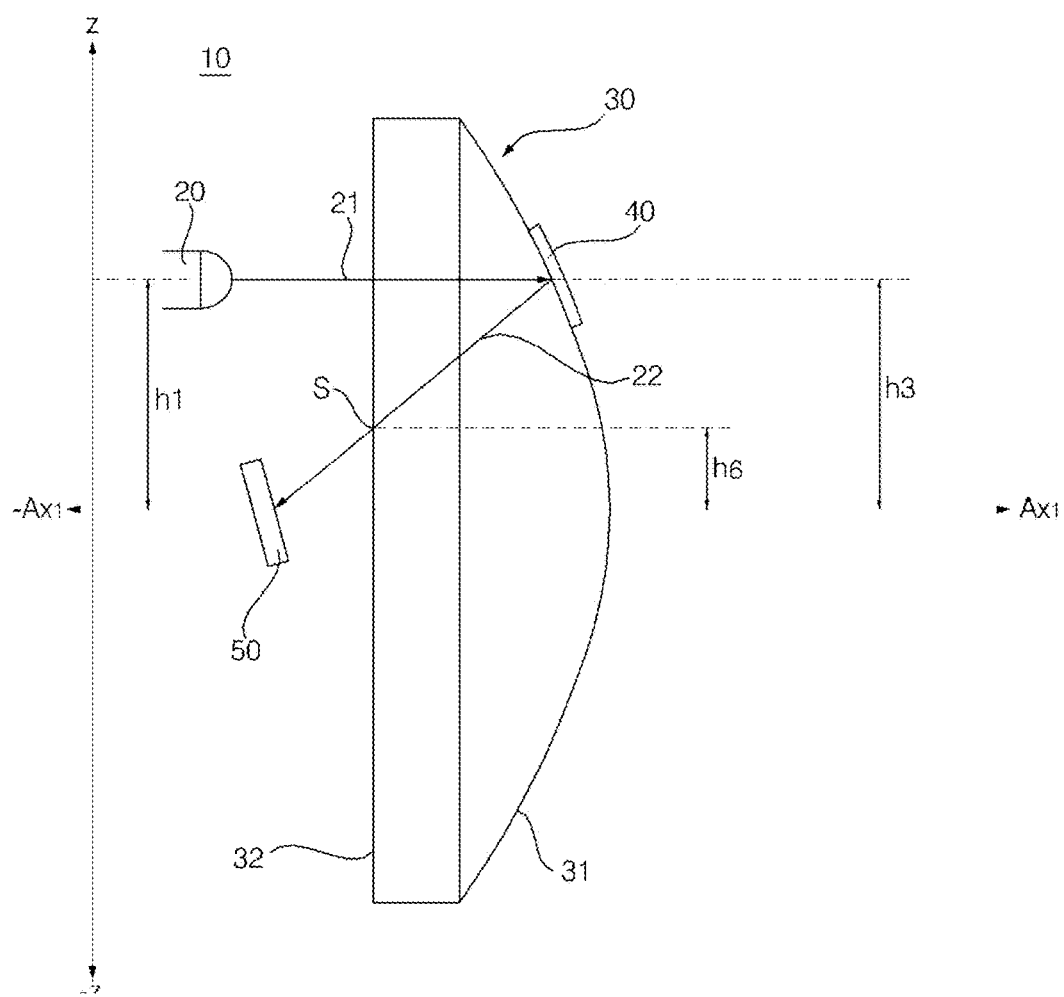
FIG. 11 is a reference view for explaining the position of the light emitting module according to the embodiment of the present invention.
Figure 12A:
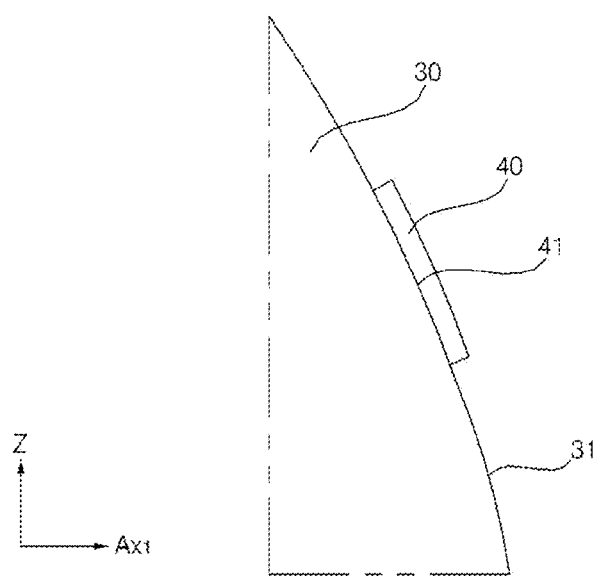
FIG. 12A is a sectional view of a condensing lens taken along line I-I of FIG. 9A.
Figure 12B:
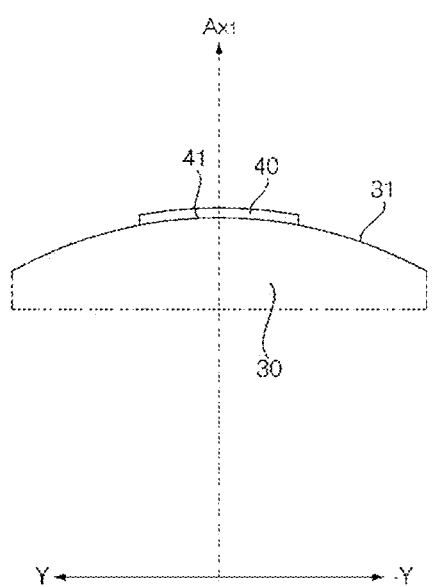
FIG. 12B is a sectional view of the condensing lens taken along line II-II of FIG. 9B.
Figure 13A:
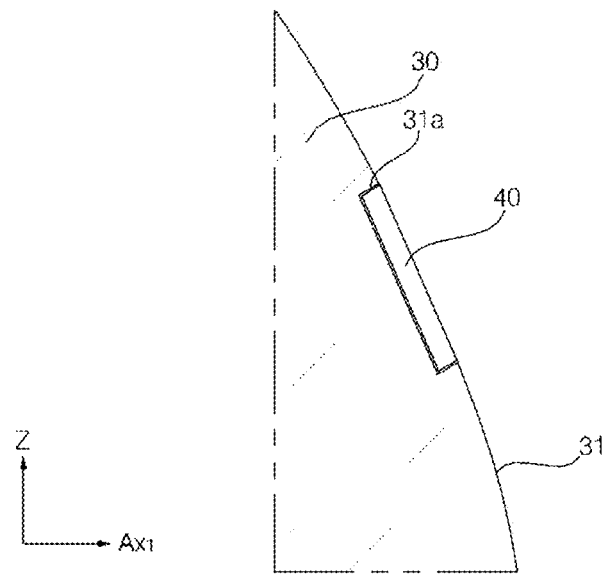
FIG. 13A is a sectional view of a condensing lens and a first optical path conversion member according to another embodiment of the present invention.
Figure 13B:
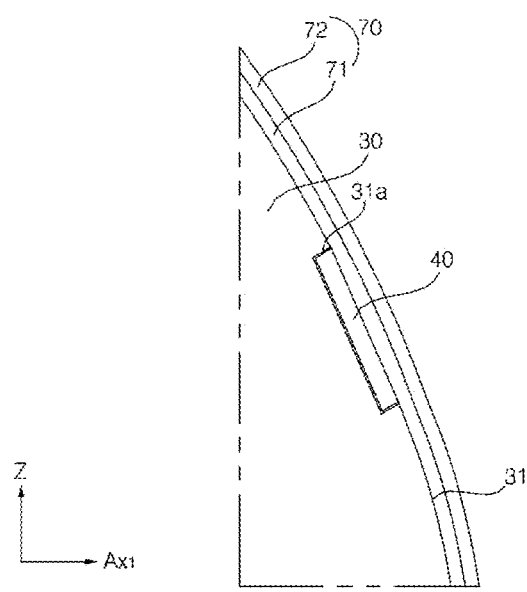
FIG. 13B is a sectional view of a condensing lens and a first optical path conversion member according to another embodiment of the present invention.
Figure 13C:
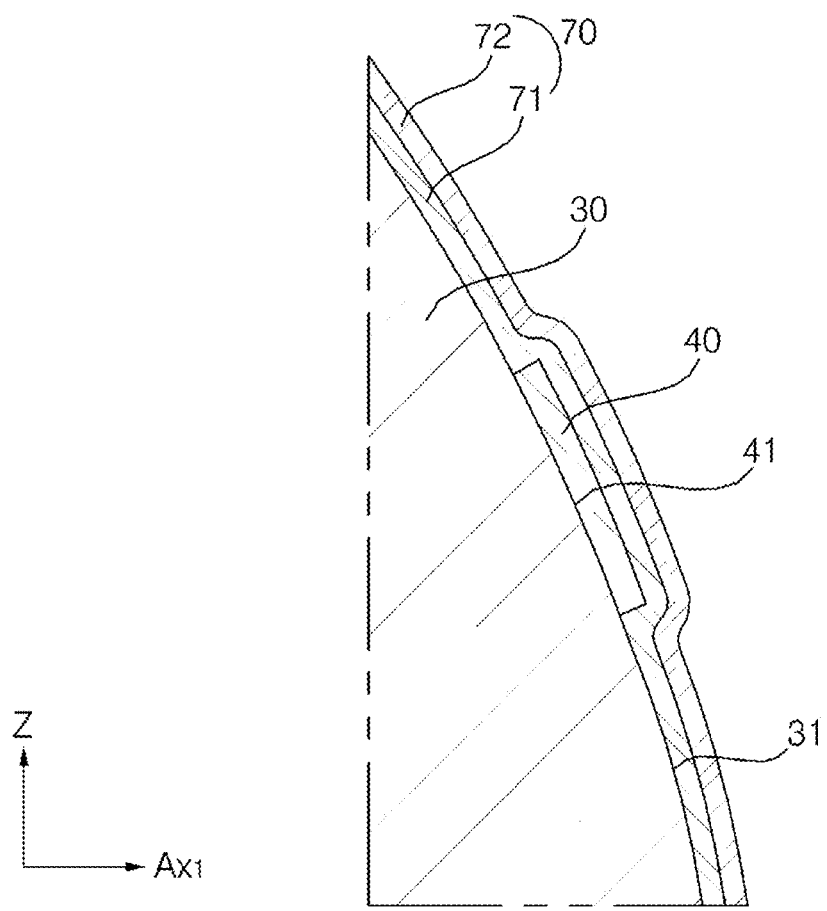
FIG. 13C is a sectional view of a condensing lens and a first optical path conversion member according to another embodiment of the present invention.
Figure 13D:
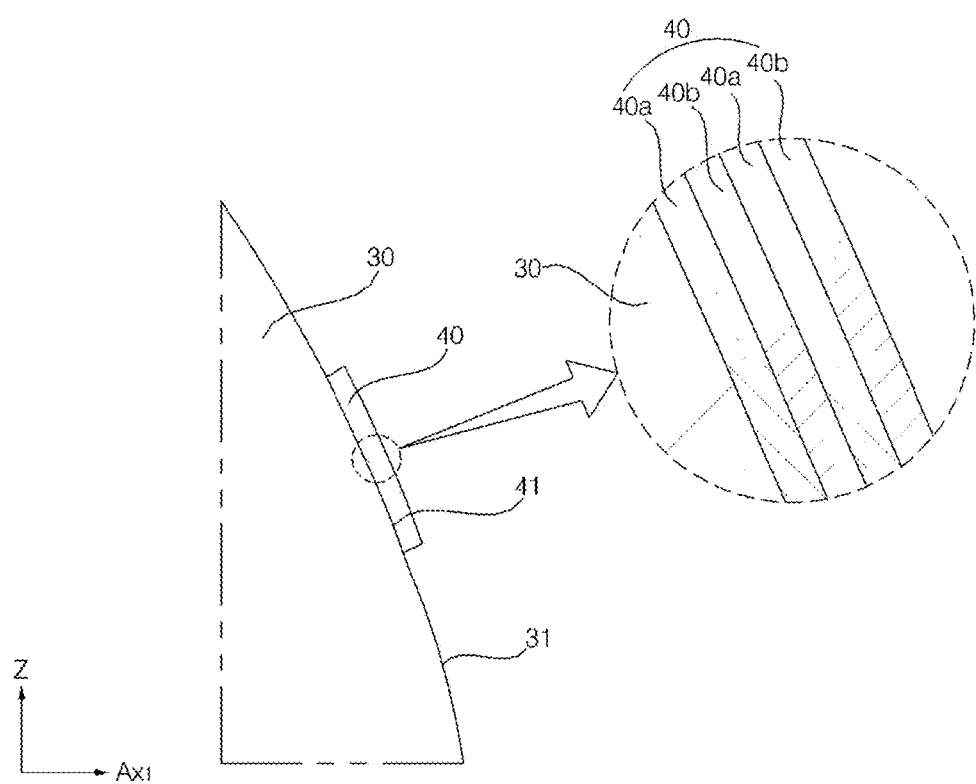
FIG. 13D is a sectional view of a condensing lens and a first optical path conversion member according to a further embodiment of the present invention.
Figure 14A:
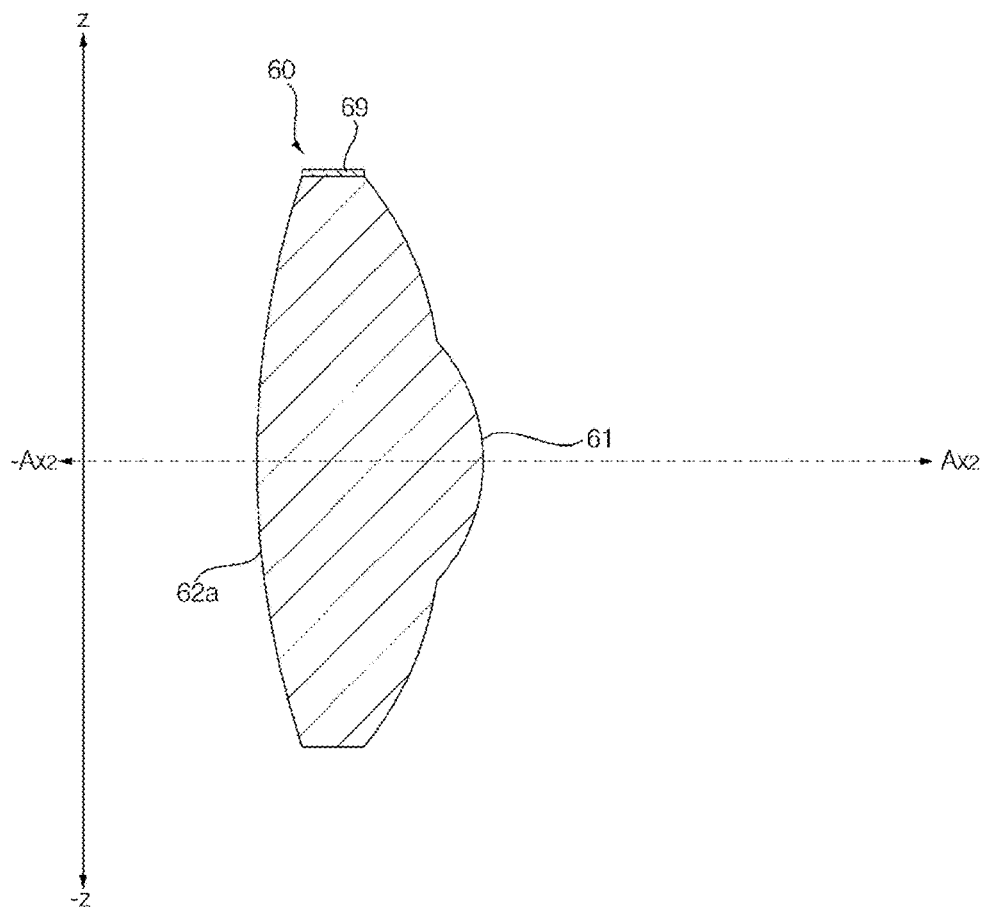
FIG. 14A is a longitudinal sectional view cut through an auxiliary condensing lens according to an embodiment of the present invention in the vertical direction.
Figure 14B:
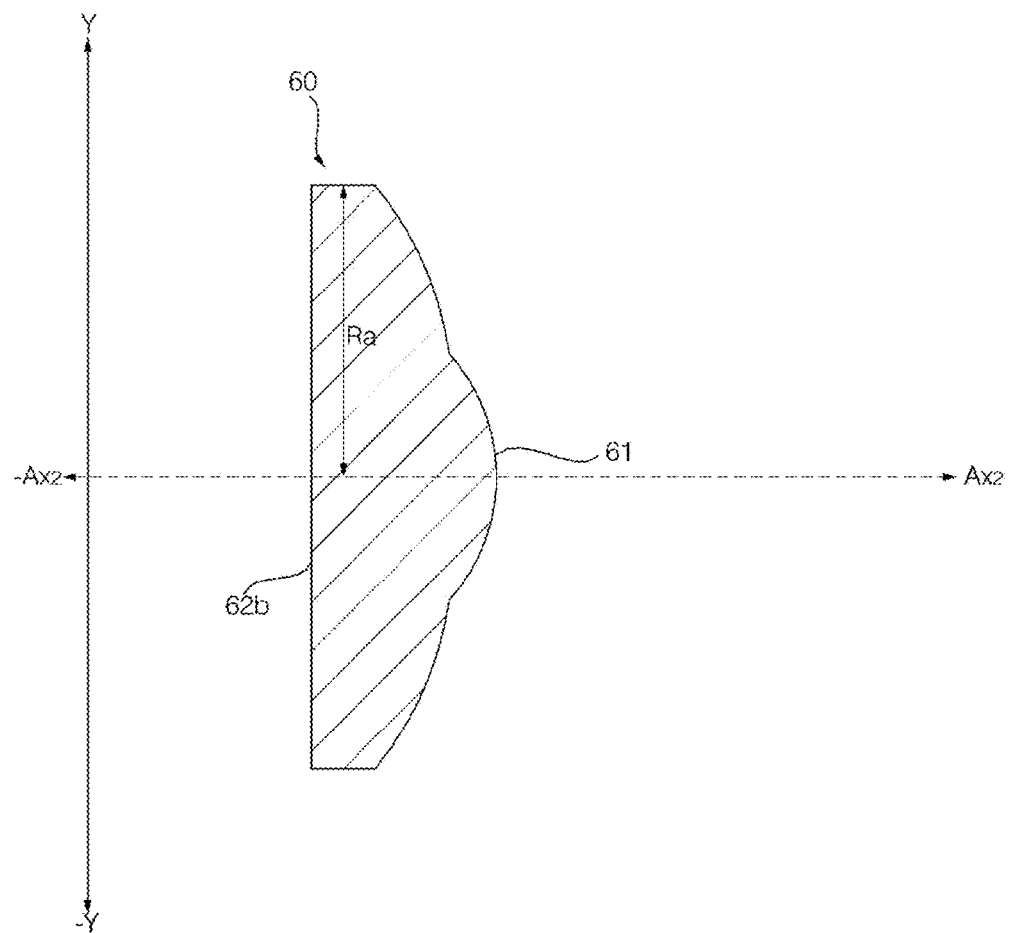
FIG. 14B is a cross sectional view cut through the auxiliary condensing lens according to the embodiment of the present invention in the horizontal direction.

FIG. 11 is a reference view for explaining the position of the light emitting module according to the embodiment of the present invention.

Using the above refraction formula, a distance h between each component and the central axis Ax1 of the condensing lens 30 can be calculated.

The condensing lens 30 in this embodiment is embodied as an aspherical lens, in which a radius of curvature of a center portion is smaller than that of an edge portion.

The light source 20, the first optical path conversion member 40, the second optical path conversion member 50, and the wavelength conversion unit 70 are disposed so as to overlap the condensing lens 30 when viewed from the front of the central axis Ax1 of the condensing lens 30. Therefore, the size of a housing accommodating the light emitting module 10 may be reduced to the size of the condensing lens 30.

Specifically, a first distance h1 between the central axis Ax1 of the condensing lens 30 and the light source 20 is smaller than a radius L of the condensing lens 30. Here, the first distance h1 is calculated using the above-mentioned distance calculation formula.

In addition, a second distance h2 between the central axis Ax1 of the condensing lens 30 and the second optical path conversion member 50 is 0. The second optical path conversion member 50 is located behind the rear surface 32 of the condensing lens 30 such that the second optical path conversion member 50 is spaced apart from the condensing lens 30 in the rearward direction.

Meanwhile, a third distance h3 between the central axis Ax1 of the condensing lens 30 and the first optical path conversion member 40 is smaller than the radius L of the condensing lens 30, and is greater than 0. Of course, the third distance h3 is also calculated using the above-mentioned distance calculation formula. For example, a ratio of the first distance h1 to the third distance h3 may be in the range of 1:0.9 to 1:1.1. Specifically, the first distance h1 and the third distance h3 may be equal to each other.

A sixth distance h6 between the central axis Ax1 of the condensing lens 30 and an exit spot S of the first reflected light 22 may be smaller than the first distance h1 or the second distance h2. For example, a ratio of the first distance h1 of the light source 20 to sixth distance h6 of the exit spot S may be in the range of 1:0.1 to 1:0.6.

For convenience of assembly, the light emitting module 10 is generally accommodated in a hexahedron-shaped housing. By disposing the light source 20 at the upper portion behind the condensing lens 30 and disposing the second optical path conversion member 50 at the middle portion behind the condensing lens 30, the length of the light emitting module 10 may be reduced, and space utilization may be maximized. As a result, the light emitting module 10 may be easily accommodated in the housing.

Furthermore, by disposing the auxiliary condensing lens 60 in front of the condensing lens 30 and disposing the first optical path conversion member 40 at the upper portion in front of the condensing lens 30, the length of the light emitting module 10 may be reduced, and space utilization may be maximized. As a result, the light emitting module 10 may be easily accommodated in the housing.

In addition, by disposing the second optical path conversion member 50 and the wavelength conversion unit 70 on the central axis Ax1 of the condensing lens 30, light is incident on the condensing lens 30 from the wavelength conversion unit 70 along the central axis Ax1 of the condensing lens 30, whereby light efficiency is improved.

Figure 15A:
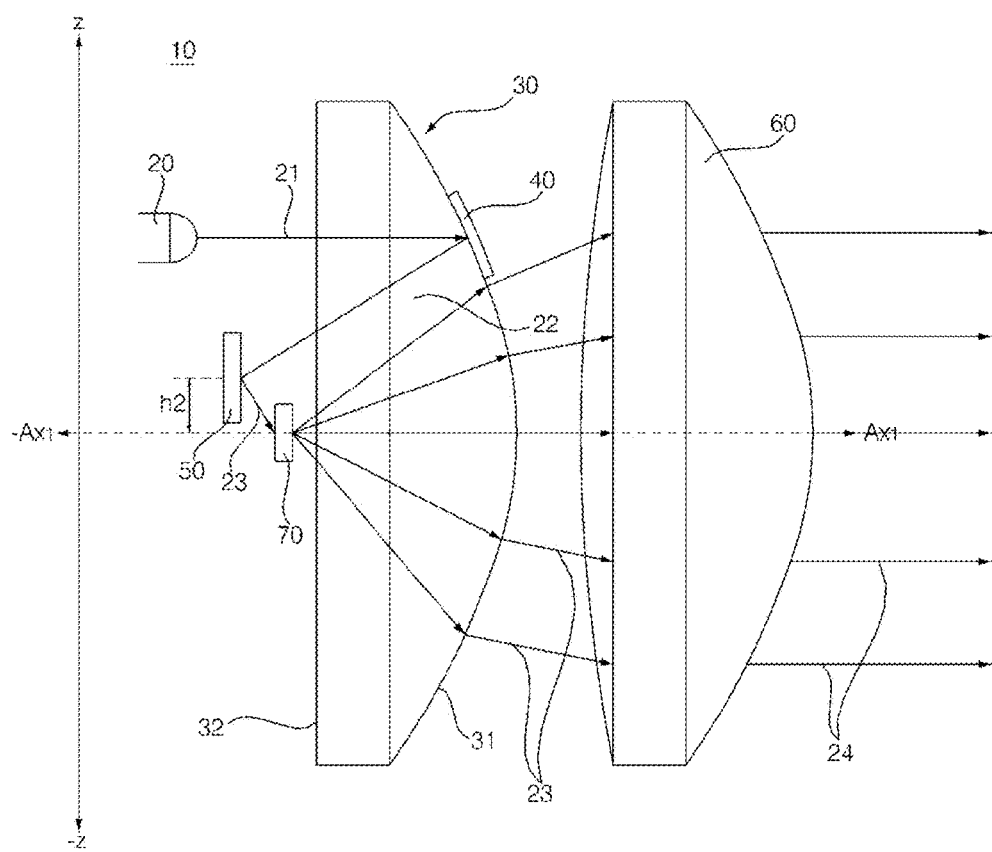
FIG. 15A is a conceptual view of a light emitting module according to another embodiment of the present invention.

FIG. 15A is a conceptual view of a light emitting module according to another embodiment of the present invention.

Referring to FIG. 15A, a light emitting module 10 according to this embodiment is different from the light emitting module shown in FIG. 9 in terms of the disposition of the second optical path conversion member 50. Other components of the light emitting module 10 according to this embodiment are identical to those of the light emitting module shown in FIG. 9. Hereinafter, therefore, only the difference between the light emitting module 10 according to this embodiment and the light emitting module shown in FIG. 9 will be described.

In this embodiment, the second optical path conversion member 50 is decentered with respect to the central axis Ax1 of the condensing lens 30. Specifically, the second optical path conversion member 50 is spaced apart from the central axis Ax1 of the condensing lens 30 in the first direction (the direction of Z-axis). In this case, the reflection surface of the second optical path conversion member 50 is disposed so as to be perpendicular to an arbitrary line that is parallel to the central axis Ax1 of the condensing lens 30.

Second reflected light 23 radiated from the second optical path conversion member 50 is incident on the wavelength conversion unit 70. In this embodiment, overlapping between the light incident on the second optical path conversion member 50 and the light radiated from the wavelength conversion unit 70 may be reduced.

Figure 15B:
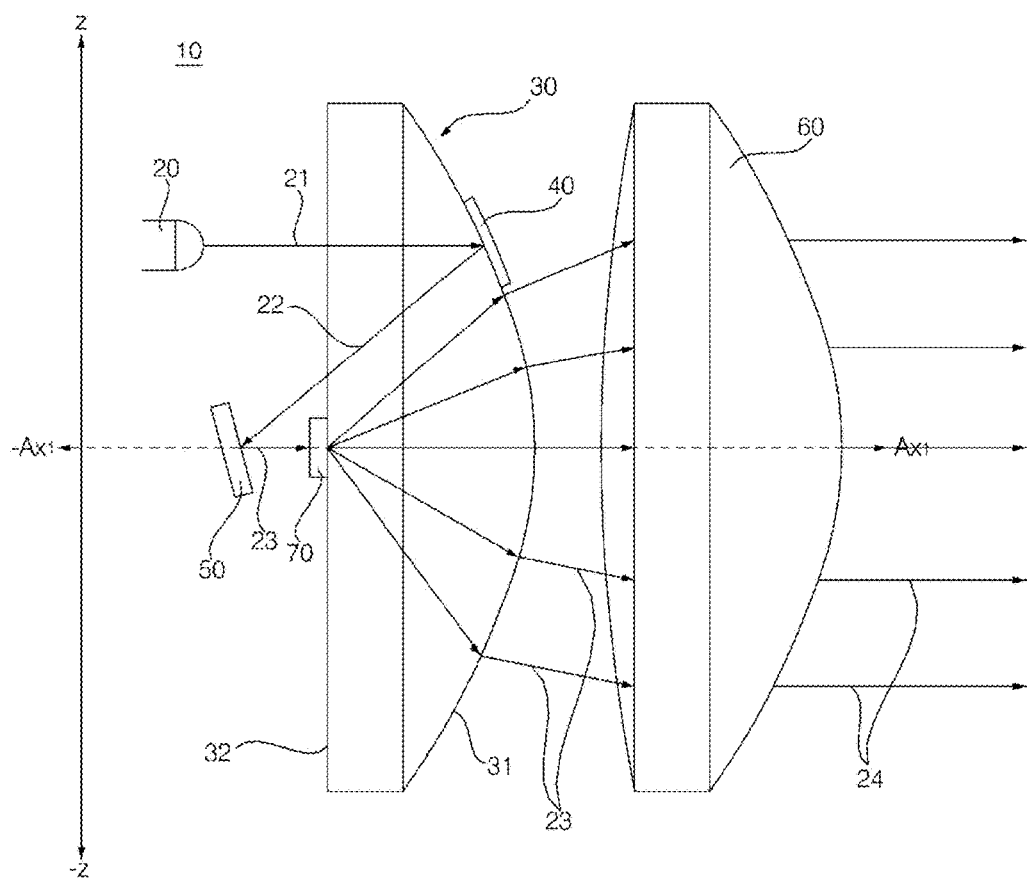
FIG. 15B is a conceptual view of a light emitting module according to another embodiment of the present invention.

FIG. 15B is a conceptual view of a light emitting module according to another embodiment of the present invention.

Referring to FIG. 15B, a light emitting module 10 according to this embodiment is different from the light emitting module shown in FIG. 9 in terms of the disposition of the wavelength conversion unit 70.

In this embodiment, the wavelength conversion unit 70 is disposed on one surface of the condensing lens 30. Specifically, the wavelength conversion unit 70 is disposed on the rear surface 32 of the condensing lens 30. The wavelength conversion unit 70 may be attached to or coated on the rear surface 32 of the condensing lens 30.

In this case, the wavelength conversion unit 70 is located at the center of the rear surface 32 of the condensing lens 30.

Figure 15C:
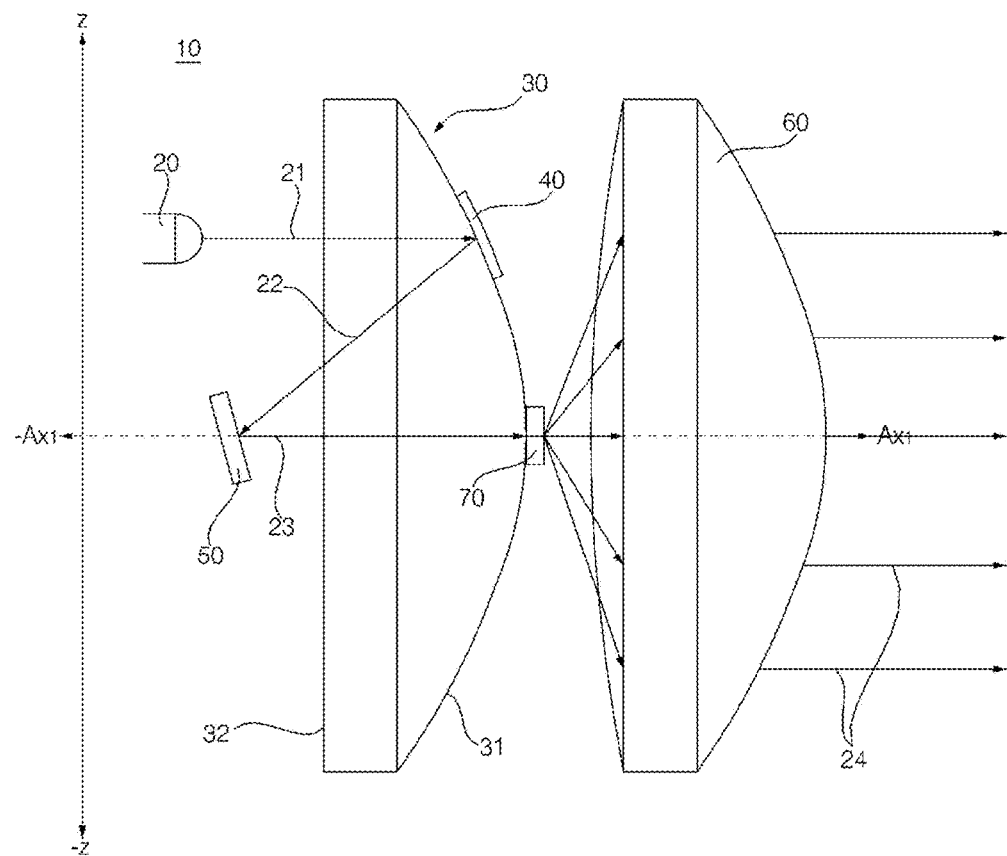
FIG. 15C is a conceptual view of a light emitting module according to another embodiment of the present invention.

FIG. 15C is a conceptual view of a light emitting module according to another embodiment of the present invention.

Referring to FIG. 15C, a light emitting module 10 according to this embodiment is different from the light emitting module shown in FIG. 9 in terms of the disposition of the wavelength conversion unit 70.

In this embodiment, the wavelength conversion unit 70 is disposed on one surface of the condensing lens 30. Specifically, the wavelength conversion unit 70 is disposed on the front surface 31 of the condensing lens 30. The wavelength conversion unit 70 may be attached to or coated on the front surface 31 of the condensing lens 30. The wavelength conversion unit 70 is located at the center of the front surface 31 of the condensing lens 30.

In this case, second reflected light 23 radiated from the second optical path conversion member 50 is condensed while passing through the center of the condensing lens 30, and is provided to the wavelength conversion unit 70, which is disposed on the front surface 31 of the condensing lens 30. The wavelength of the light is converted by the wavelength conversion unit 70. The light the wavelength of which has been converted is provided to the auxiliary condensing lens 60.

Figure 15D:
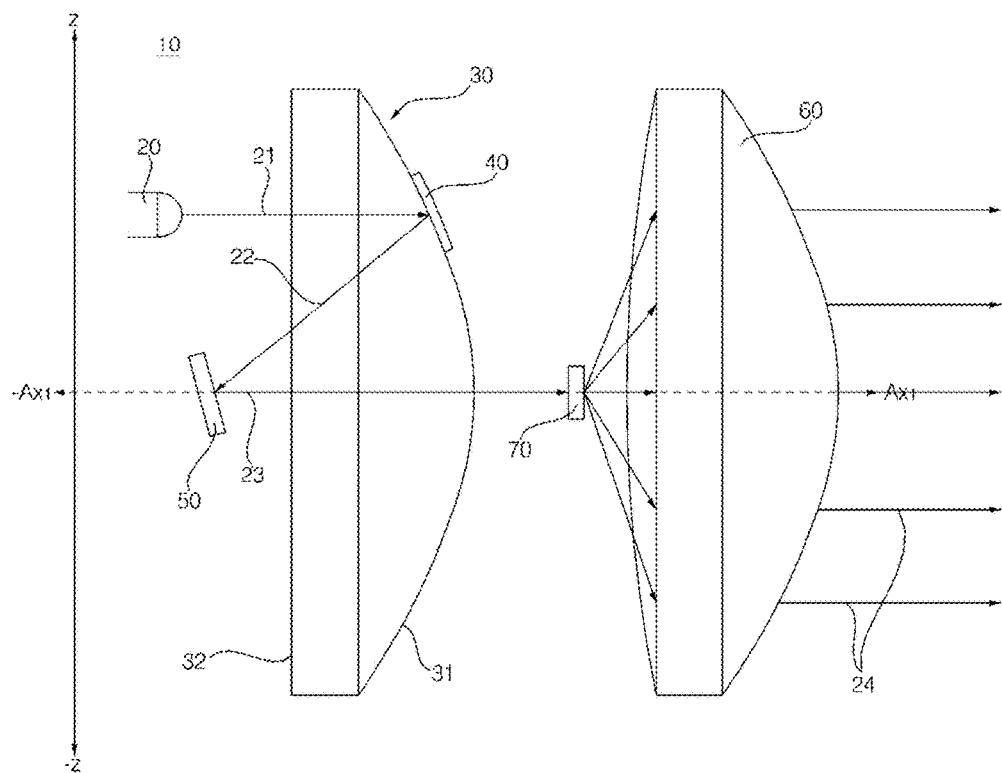
FIG. 15D is a conceptual view of a light emitting module according to a further embodiment of the present invention.

FIG. 15D is a conceptual view of a light emitting module according to a further embodiment of the present invention.

Referring to FIG. 15C, a light emitting module 10 according to this embodiment is different from the light emitting module shown in FIG. 9 in terms of the disposition of the wavelength conversion unit 70.

In this embodiment, the wavelength conversion unit 70 is disposed between the condensing lens 30 and the auxiliary condensing lens 60. Specifically, the wavelength conversion unit 70 is located on the central axis Ax1 of the condensing lens 30 between the condensing lens 30 and the auxiliary condensing lens 60.

In this case, second reflected light 23 radiated from the second optical path conversion member 50 is condensed while passing through the center of the condensing lens 30, and is provided to the wavelength conversion unit 70, which is disposed in front of the condensing lens 30. The wavelength of the light is converted by the wavelength conversion unit 70. The light the wavelength of which has been converted is provided to the auxiliary condensing lens 60.

Figure 16:
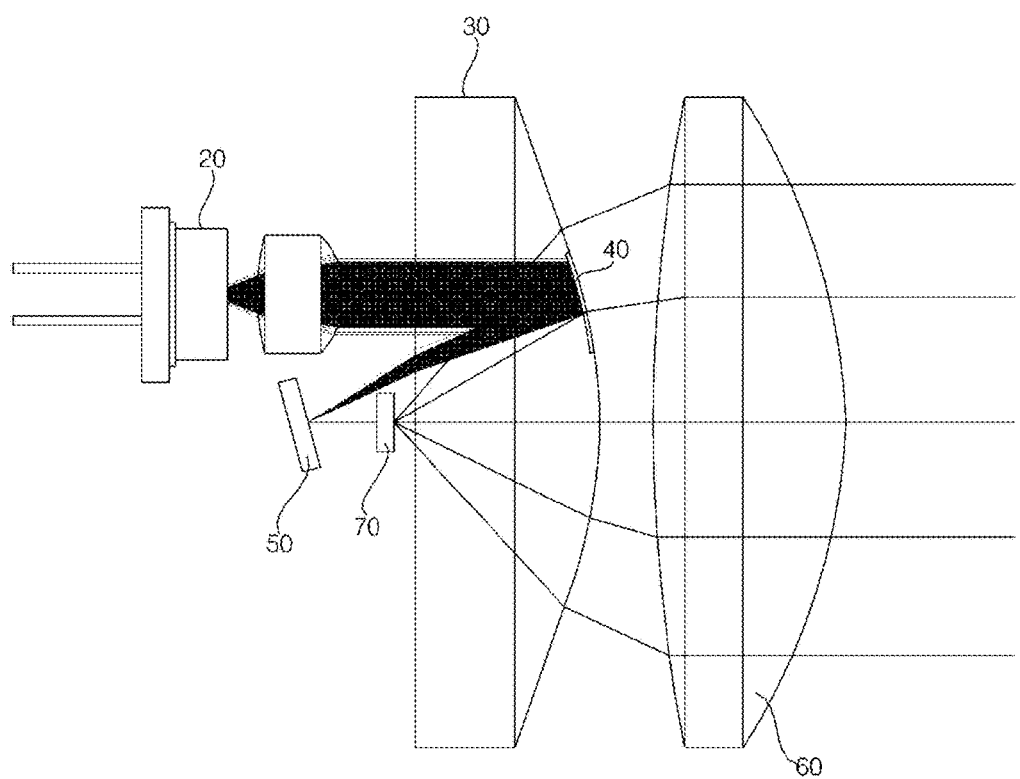
FIG. 16 is a view illustrating an optical path of the light emitting module according to the present invention.

FIG. 16 is a view illustrating an optical path of the light emitting module according to the present invention.

Referring to FIG. 16, first light 21 generated by the light source 20 is incident on the upper region (first region) of the condensing lens 30, is refracted, and is then radiated from the condensing lens 30. The first light 21 radiated from the condensing lens 30 is incident on the first optical path conversion member 40.

The first light 21 incident on the first optical path conversion member 40 is reflected therefrom, and is radiated as first reflected light 22. The first reflected light 22 is incident on the upper region (second region) of the condensing lens 30. The first reflected light 22 is radiated rearward through the upper region of the condensing lens 30.

The first reflected light 22 radiated from the condensing lens 30 is incident on the second optical path conversion member 50. The first reflected light 22 is converted into white light by wavelength conversion of the second optical path conversion member 50, is reflected from the second optical path conversion member 50, and is radiated as second reflected light 23.

At this time, since the second reflected light 23 undergoes Lambertian reflection, the second reflected light 23 becomes fan-shaped light which is directed at a predetermined emission angle based on an arbitrary line parallel to the optical axis.

The second reflected light 23 is incident on the middle part of the condensing lens 30, is refracted, and is radiated ahead of the condensing lens 30.

The second reflected light 23 radiated from the condensing lens 30 is condensed by the auxiliary condensing lens 60, and is radiated as second light 24.

In particular, the majority of the second reflected light 23 is incident into the auxiliary condensing lens 60, and is refracted so as to become parallel light.

Figure 17:
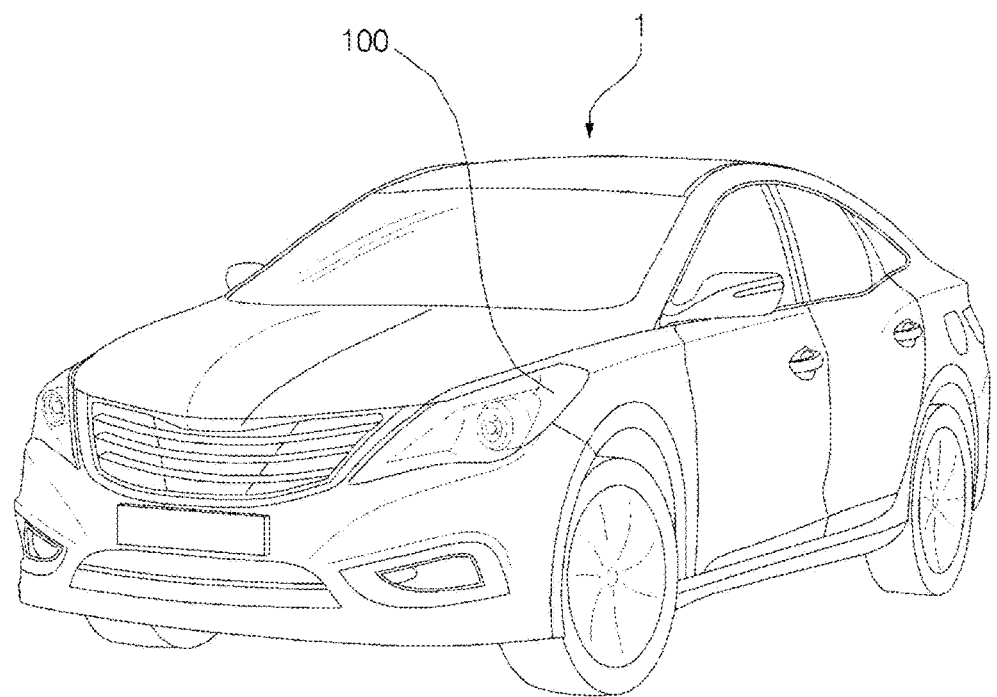
FIG. 17 is a view illustrating a car equipped with a light-emitting module according to the present invention.
Figure 18:
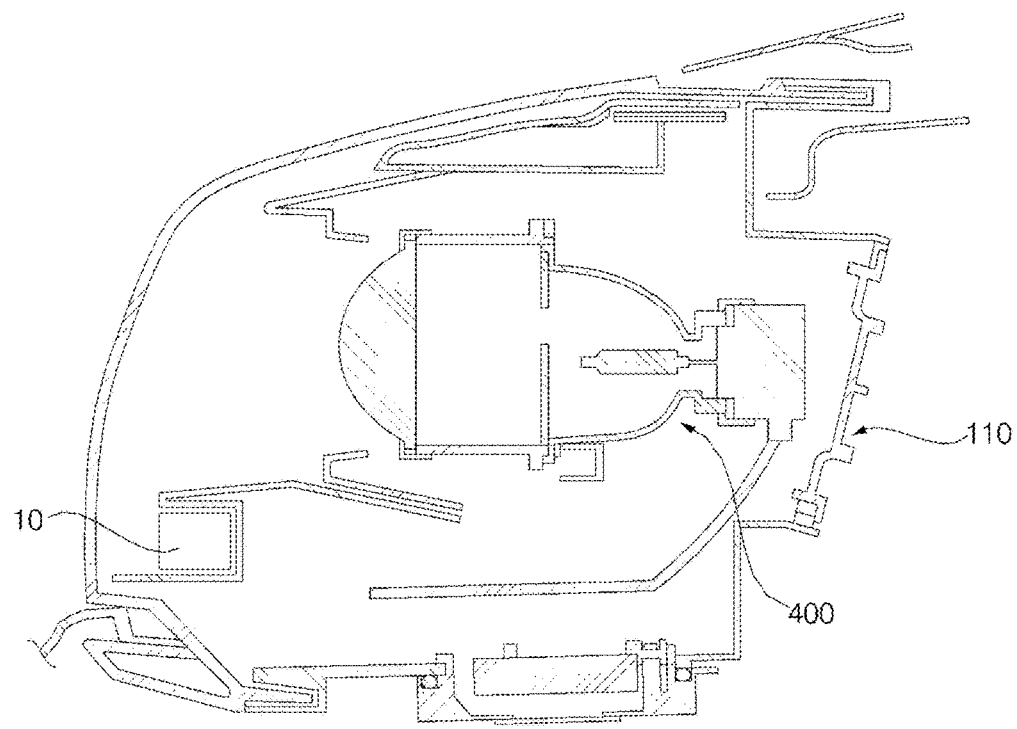
FIG. 18 is a sectional view illustrating a lamp device for vehicles including a light-emitting module according to the present invention.
Figure 19:
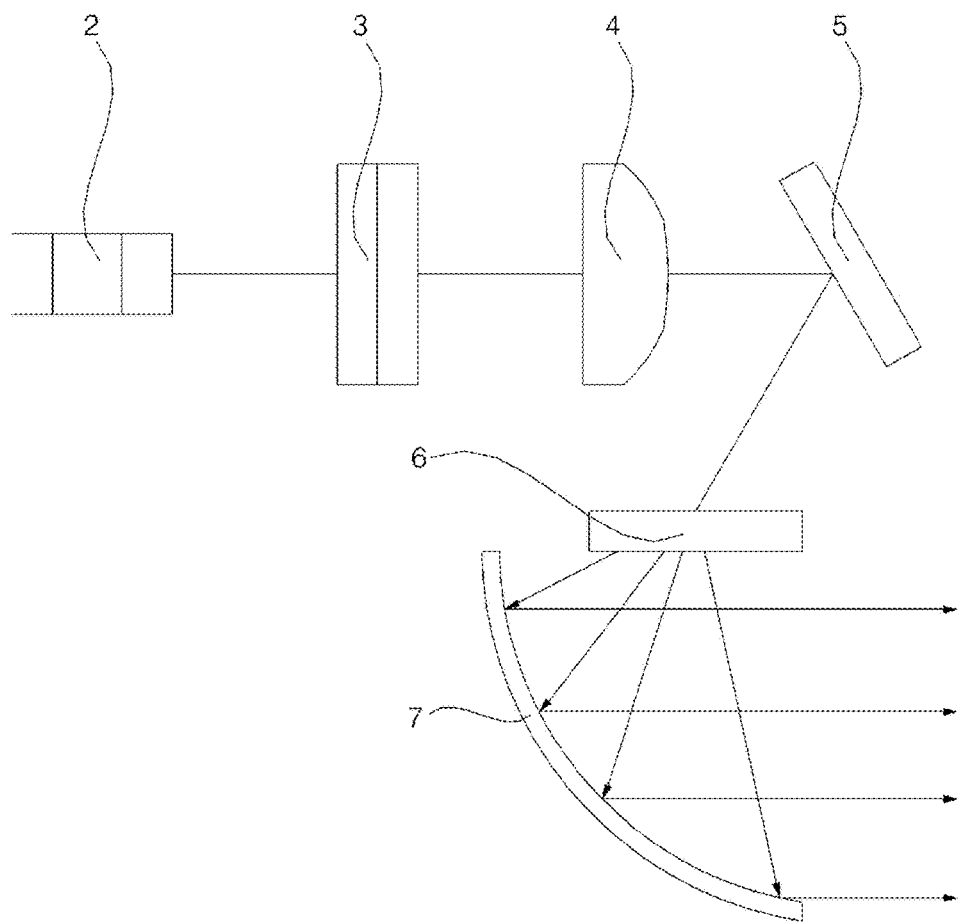
FIG. 19 is a conceptual view of a conventional light-emitting module.

FIG. 17 is a view illustrating a car equipped with the light-emitting module 10 according to the present invention, and FIG. 18 is a sectional view illustrating a lamp device for vehicles including the light-emitting module 10 according to the present invention.

Referring to FIG. 17, the light-emitting module 10 according to the embodiment is mounted to the front portion of a vehicle 1. The light-emitting module 10 may be accommodated in an automotive lamp device 100, and the automotive lamp device 100 may be mounted to the front portion of the vehicle 1. In this embodiment, the automotive lamp device 100 includes a head lamp for illuminating the area ahead while driving at night, a fog lamp, a turn signal lamp and so on.

In another embodiment, the automotive lamp device may be mounted to the rear portion of the vehicle 1 so as to function as a tail lamp.

Referring to FIG. 18, the automotive lamp device 100 according to an embodiment of the present invention comprises the lamp housing 110 and the light-emitting module 10 accommodated in the lamp housing 110.

According to embodiments, the automotive lamp device 100 may further comprise a light source unit 400.

The lamp housing 110 provides a space in which the light-emitting module 10 and/or the light source unit 400 are disposed.

The light source unit 400 functions to output light which is necessary for vehicle driving.

Here, the light-emitting module 10 and the light source unit 400 may emit the same type of light. Preferably, the light emitted from the light-emitting module 10 may have a different color from that emitted from the light source unit 400, or one thereof may be plane light and the other may be point light.

The light emitted from the light source unit 400 has good diffusivity and may be used to illuminate a region spaced apart by a short distance. The light emitted from the light-emitting module 10 has good straightness and may be used to illuminate a small region spaced apart by a long distance.

The light-emitting module 10 may use a laser diode, and the light source unit 400 may use a xenon lamp.

According to embodiments, by disposing the light source at the upper portion behind the condensing lens and disposing the second reflection unit at the lower portion behind the condensing lens, the length of the light-emitting module may be reduced, and space utilization may be maximized. As a result, the light-emitting module may be easily accommodated in the housing.

Further, by disposing the auxiliary condensing lens at the lower portion in front of the condensing lens and disposing the first reflection unit at the upper portion in front of the condensing lens, the length of the light-emitting module may be reduced, and space utilization may be maximized, so that the light-emitting module can be easily accommodated in the housing.

Further, since the condensing lens is divided into the upper and lower regions, each of which is used as an optical path, the number of components may be decreased and the manufacturing cost may be reduced.

Further, by using the reflective phosphor, the optical efficiency may be enhanced.

Further, the light-emitting module may emit light having good light convergence and straightness, despite having a simple structure.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light emitting module comprising:
   a lens;
   a light source configured to provide first light to pass through the lens;
   a first reflection unit configured to reflect the first light to provide first reflected light to pass through the lens;
   a second reflection unit configured to reflect the first reflected light to provide second reflected light to pass through the lens; and
   a phosphor configured to receive the second reflected light, convert a wavelength of the received second reflected light, and radiate light the wavelength of which has been converted,
   wherein the phosphor comprises:
      an incidence surface on which the second reflected light is incident,
      an emission surface from which the incident second reflected light is emitted, and
      side surfaces that connect the incidence surface and the emission surface.

2. The light emitting module according to claim 1, wherein the phosphor is disposed between the second reflection unit and the lens.

3. The light emitting module according to claim 2, wherein the phosphor is positioned on a central axis of the lens.

4. The light emitting module according to claim 2, wherein the phosphor is positioned so as to be decentered with respect to a central axis of the lens.

5. The light emitting module according to claim 1, further comprising an auxiliary lens for condensing the second reflected light.

6. The light emitting module according to claim 5, wherein the phosphor is disposed between the lens and the auxiliary lens.

7. The light emitting module according to claim 5, wherein the auxiliary lens is positioned so as to be decentered with respect to a central axis of the lens.

8. The light emitting module according to claim 5, wherein the auxiliary lens is configured such that a central axis of the auxiliary lens is aligned with a central axis of the lens.

9. The light emitting module according to claim 1, wherein the phosphor is positioned on one surface of the lens.

10. The light emitting module according to claim 1, further comprising a heat sink disposed on the side surfaces of the phosphor in a contact fashion.

11. The light emitting module according to claim 1, wherein the incidence surface and the emission surface of the phosphor are arranged so as to intersect a central axis of the lens.

12. The light emitting module according to claim 1, wherein the light source and the first reflection unit are positioned so as to be decentered with respect to a central axis of the lens.

13. The light emitting module according to claim 12, wherein the second reflection unit is positioned so as to be decentered with respect to the central axis of the lens.

14. The light emitting module according to claim 13, wherein the light source and the second reflection unit are arranged so as to be opposite to each other with respect to the central axis of the lens.

15. The light emitting module according to claim 1, wherein the lens is divided into a first region and a second region by a section cut along a central axis of the lens, and
wherein the first light is incident on the first region, the first reflected light is incident on the second region, and the second reflected light is incident on the second region.

16. The light emitting module according to claim 15, wherein the first light is incident parallel to the central axis of the lens.

17. The light emitting module according to claim 1, wherein the second reflected light emitted from the second reflection unit passes through a central axis of the lens.

18. The light emitting module according to claim 1, wherein the first reflection unit is disposed on a front surface of the lens.

19. The light emitting module according to claim 18, wherein the first reflection unit comprises a plurality of dielectric layers having different refractive indices.

* * * * *